(12) United States Patent
Schade et al.

(10) Patent No.: US 11,799,438 B2
(45) Date of Patent: Oct. 24, 2023

(54) INTEGRATED CIRCUIT WITH INDUCTIVE PICKUP LOOP

(71) Applicant: Infineon Technologies AG, Neubiberg (DE)

(72) Inventors: Alexander Schade, Unterhaching (DE); Sergey Miropolskiy, Munich (DE)

(73) Assignee: Infineon Technologies AG, Neubiberg (DE)

( * ) Notice: Subject to any disclaimer, the term of this patent is extended or adjusted under 35 U.S.C. 154(b) by 220 days.

(21) Appl. No.: 17/322,187

(22) Filed: May 17, 2021

(65) Prior Publication Data

US 2022/0367571 A1 Nov. 17, 2022

(51) Int. Cl.
| | |
|---|---|
| *H03H 7/09* | (2006.01) |
| *H03H 1/00* | (2006.01) |
| *H10K 39/00* | (2023.01) |
| *H10K 19/10* | (2023.01) |
| *H10K 19/00* | (2023.01) |
| *H03H 7/06* | (2006.01) |

(52) U.S. Cl.
CPC ............ *H03H 7/09* (2013.01); *H03H 1/0007* (2013.01); *H03H 7/06* (2013.01); *H10K 19/10* (2023.02); *H10K 19/201* (2023.02); *H10K 39/00* (2023.02)

(58) Field of Classification Search
CPC ........... H03H 1/0007; H03H 7/09; H03H 7/06
USPC ......................................... 333/172, 177, 185
See application file for complete search history.

(56) References Cited

U.S. PATENT DOCUMENTS

| 10,985,724 B1* | 4/2021 | Wang .................. H01F 27/2804 |
| 2014/0320230 A1* | 10/2014 | Jooyaie ............... H01F 27/2804 |
| | | 333/25 |

* cited by examiner

*Primary Examiner* — Rakesh B Patel
(74) *Attorney, Agent, or Firm* — COOPER LEGAL GROUP, LLC

(57) ABSTRACT

An integrated circuit including a first circuit module and a second circuit module is provided. A layer stack may include one or multiple metal layers with a power segment and a ground segment connected to the first circuit module and the second circuit module, which form a resonant current loop. A pickup loop may be inductively coupled to the resonant current loop to dampen its resonance, thereby making the IC compliant with its EMC requirements or removing functional errors such as problems in the signal or power integrity.

20 Claims, 21 Drawing Sheets

INTEGRATED CIRCUIT WITH INDUCTIVE PICKUP LOOP

TECHNICAL FIELD

The present disclosure relates generally to integrated circuits.

BACKGROUND

An integrated circuit may be formed in layers and includes circuit elements, such as transistors, grouped as modules. Metal layers, known as interconnect layers or interconnects, are stacked layer structures that electrically connect the circuit elements. A low-ohmic power metal layer or a plurality of power metal layers or other metal layers may provide power and/or ground to the integrated circuit modules.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

According to some embodiments, an integrated circuit including a first circuit module and a second circuit module is provided. A layer stack may include a power metal layer with a power segment and a ground segment connected to the first circuit module and the second circuit module, which form a resonant current loop. A pickup loop may be inductively coupled to the resonant current loop to reduce a Q-factor of the resonant current loop.

According to some embodiments, an integrated circuit including a first circuit module and a second circuit module is provided. A layer stack may include a power metal layer with a power segment and a ground segment connected to the first circuit module and the second circuit module, which form a resonant current loop having a resonant frequency. A structure may be inductively coupled to the resonant current loop having a resistance tuned to generate losses at the resonant frequency.

According to some embodiments, an integrated circuit including a first circuit module and a second circuit module is provided. A layer stack may include a power metal layer with a power segment and a ground segment connected to the first circuit module and the second circuit module, which form a resonant current loop. A pickup loop may be inductively coupled to the resonant current loop. The pickup loop may include a section vertically adjacent to the power segment. A first loop area is spanned by the resonant current loop and a second loop area is spanned by the pickup loop such that the first loop area may overlap the second loop area by a threshold amount to dampen a resonance of the resonant current loop.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DETAILED DESCRIPTION

Figure 1:
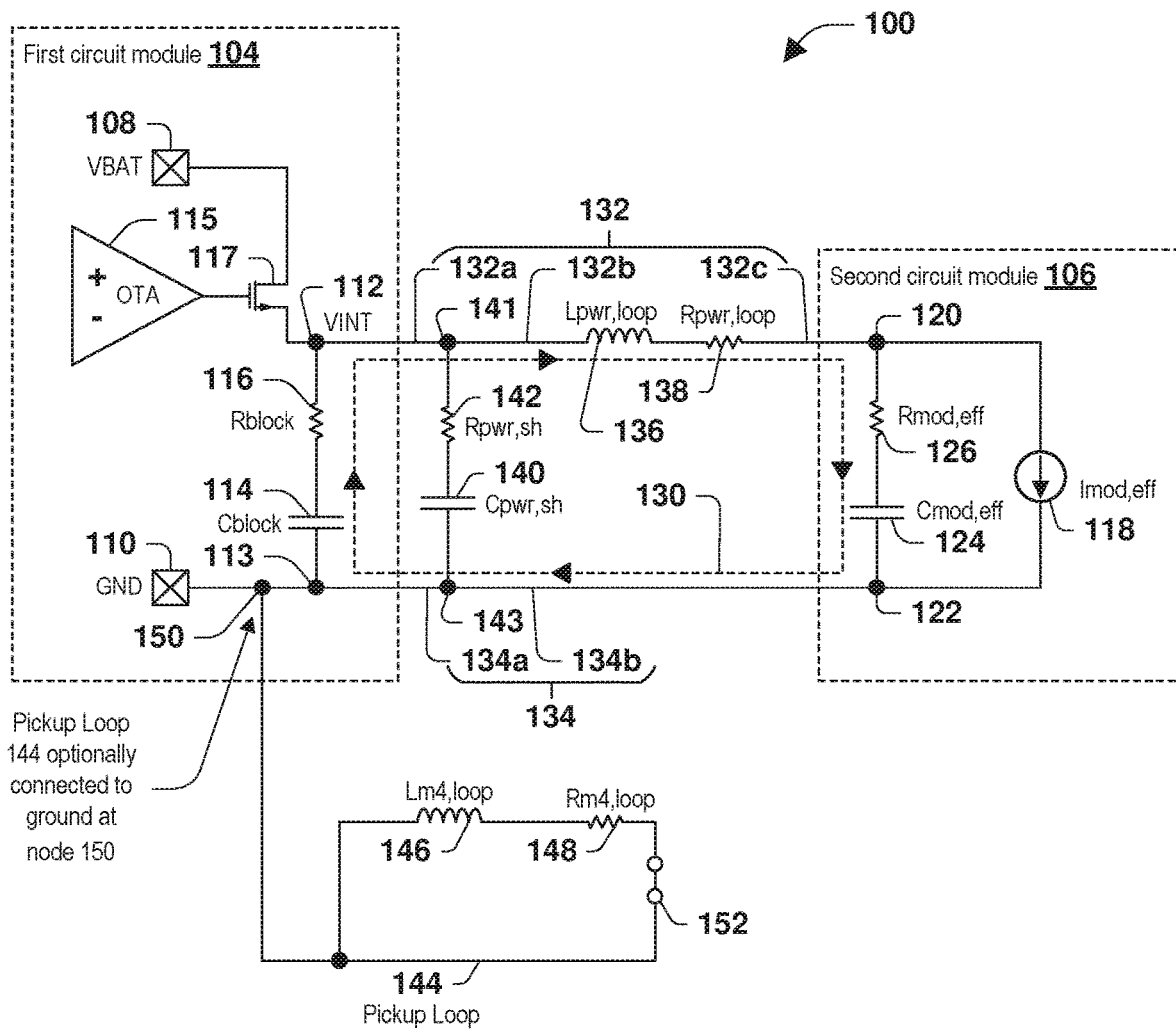
FIG. 1 is a circuit diagram of an integrated circuit, according to some examples.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

It is to be understood that the following description of embodiments is not to be taken in a limiting sense. The scope of the present disclosure is not intended to be limited by the embodiments described hereinafter or by the drawings, which are taken to be illustrative only. The drawings are to be regarded as being schematic representations and elements illustrated in the drawings are not necessarily shown to scale. Rather, the various elements are represented such that their function and general purpose become apparent to a person skilled in the art.

All numerical values within the detailed description and the claims herein are modified by "about" or "approximately" the indicated value, and take into account experimental error and variations that would be expected by a person having ordinary skill in the art.

The term "over" and/or "overlying" is not to be construed as meaning only "directly over" and/or "having direct contact with". Rather, if one element is "over" and/or "overlying" another element (e.g., a region is overlying another region), a further element (e.g., a further region) may be positioned between the two elements (e.g., a further region may be positioned between a first region and a second region if the first region is "over" and/or "overlying" the second region). Further, if a first element is "over" and/or "overlying" a second element, at least some of the first element may be vertically coincident with the second element, such that a vertical line may intersect the first element and the second element.

The semiconductor substrate or body may extend along a main extension plane. The term "horizontal" as used in this specification intends to describe an orientation substantially parallel to said main extension plane. A first or main horizontal side of the semiconductor substrate or body may run substantially parallel to horizontal directions or may have surface sections that enclose an angle of at most 8° (or at most 6°) with the main extension plane. The first or main horizontal side can be for instance the surface of a wafer or a die. Sometimes, the horizontal direction is also referred to as lateral direction.

The term "vertical" as used in this specification intends to describe an orientation which is substantially arranged perpendicular to the horizontal direction, (e.g., parallel to the normal direction of the first side of the semiconductor substrate or body or parallel to the normal direction of a surface section of the first side of the semiconductor substrate or body).

According to some examples, an integrated circuit (IC), also known as a chip or microchip, is provided. The IC may be subject to electromagnetic compatibility (EMC) requirements, which are based e.g., on international EMC standards and customer agreements. In the IC, circuit elements may be formed as modules (e.g., on a single semiconductor die) and interact with an electromagnetic environment. An IC may be designed to limit unintentional generation, propagation and reception of electromagnetic energy, which may cause unwanted effects such as electromagnetic interference (EMI). The IC may be a mixed-signal IC (e.g., having analog circuit elements and/or digital circuit elements formed as at least two modules). The IC may be a power integrated circuit (PIC), a Smart Power IC or a power management integrated circuit (PMIC) (e.g., having high-voltage and/or high-current circuit elements formed as at least one module). IC modules may be electrically connected by one or multiple layers of interconnect (e.g., metal layers) and zero, or one low-ohmic layer of interconnect (e.g., a power metal layer) or a plurality of low-ohmic layers of interconnect to provide common power and/or ground. A non-rectangular interconnect may have greater resistance than a rectangular interconnect due to narrowing. A low-ohmic layer or layers or other layer/layers of interconnect providing power may be referred to as power-routing and a low-ohmic layer or layers or other layer/layers of interconnect providing ground may be referred to as ground-routing. Unless explicitly noted otherwise, the term "power routing" refers to both power routing and ground routing. Mixed-signal ICs and PICs may be used, for example, as an automotive system IC, a microcontroller, and/or a system on a chip (SoC).

According to some examples, ICs may experience resonance or resonances, which may be present as resonance loops in power-routing between modules. Resonance, e.g. in the range of 30 megahertz (MHz)-30 gigahertz (GHz) may be formed from parasitic inductance, on-die power-routing, on-die ground-routing, internal capacitances, and/or external capacitances. Parasitic inductance is generally unwanted and is a consequence of the energy of the magnetic field that arises from the/a current flow. The parasitic inductance may be frequency-dependent, and it may be affected by eddy-currents induced in the substrate or in metal structures. The parasitic inductance is a function of a closed current loop, which also comprises the current return path, e.g. via ground. Examples of internal capacitances are blocking capacitors used in conjunction with on-chip linear voltage regulators and intrinsic capacitances of large circuit blocks. IC resonances may be excited by: (1) the switching activities of an IC module due to its normal operation, (2) other kinds of disturbances generated by the IC or by (3) an external disturbance that occurs in the application or by (4) an external disturbance is applied in the course of radio frequency (RF)-immunity testing. IC resonances may cause failure of internal circuit elements or modules. IC resonances may also respond to and amplify RF emissions, e.g., RF emissions of an internal digital module in a mixed-signal IC, or e.g., RF-emissions by an analog module such as an integrated DC/DC-converter or a charge pump. Dampening such resonances may be beneficial for functional operation of the IC. Dampening resonances can improve the RF-immunity, reduce RF-emissions, thereby improve the electromagnetic compatibility and lead to compliance with EMC-requirements.

According to some examples, ICs, such as mixed-signal ICs and PICs, may be connected to a number of external components (e.g., external circuit elements) to reduce incoming electromagnetic disturbances, which may include very high frequency disturbances. External components, such as decoupling capacitors, may be used to block incoming or outgoing electromagnetic disturbances. An example filter formed from external components is a multiple stage Pi filter at a battery supply. A passive Pi filter includes at least three circuit elements arranged in the shape of the Greek letter Pi ($\pi$). In some example applications, connection of an external component, such as in Pi filters, may represent a design burden associated with printed circuit board (PCB) layout. It may also increase the production costs, the PCB-area and hence the size of the ECU. Mixed-signal ICs and PICs may exhibit internal resonance, which may interact with and respond to electromagnetic disturbances. An IC may comprise a pickup loop, the function of which is to dampen the IC's internal resonance. By implementing a pickup loop in an IC one can achieve compliance with EMC-requirements by dampening the resonance, without the need to filter the incoming or outgoing disturbance with external components, e.g., a Pi filter.

Mixed-signal and power ICs may also use on-die dissipative effects, e.g., an equivalent series resistance (ESR) of on-die capacitances (such as a blocking capacitor), to reduce resonance of an individual IC module. ESR of on-die capacitances might not be specifically engineered to dampen resonance present between modules of an IC. In general, ESR is not increased arbitrarily, and such increase in ESR may reduce an ability of a tuned blocking capacitor to block RF emissions.

According to an example, an IC may be produced using a multiple process technology, which combines the features of multiple more primitive semiconductor technologies. An example type of multiple process technology are Bipolar (Bi) Complementary Metal-Oxide-Semiconductor (CMOS)

(BiCMOS) technologies, which integrate two separate kinds of semiconductor fabrication technologies (i.e., in a single die IC), namely a kind of bipolar junction transistor (BJT) technology and a kind of CMOS technology. Another class of semiconductor technologies are Double Diffused Metal Oxide Semiconductor (DMOS) technologies. DMOS-transistors may offer fast switching speeds, low on-state resistance, high channel-to-channel isolation, low capacitance, and low charge injection. Another class of multiple process technologies are Bipolar-CMOS-DMOS (BCD) technologies, which may use BJT/CMOS/DMOS devices for analog circuits, CMOS-devices for digital circuits and compatibility with high input voltages is enabled by DMOS-transistors. In ICs manufactured using multiple process technologies, such as of the type BiCMOS and BCD, resonance loops may be formed between modules via the power-routing and the ground-routing.

According to an example, one or more secondary structures (e.g., pickup loops) may be created in one or more metallization layers (also known as metal layers) in close proximity to a resonating or possibly resonating current loop on an IC. The resonating current loop may be denoted as a primary loop. It may be regarded as the primary loop of a transformer, in which the secondary loop is formed by secondary structures, which are described in the following. The secondary structures may span an area that has a significant overlap and/or is in close proximity with the primary loop, e.g., the shape of the secondary structure might closely follow or trace the resonant current path. Thereby, the secondary structures may be inductively coupled to the primary loop. The secondary structures are implemented in a way to exhibit a resistance that is significantly larger than a resistance of the primary loop. At a sufficiently low frequency, only a negligible current may be induced in the secondary structures, and hence a DC resistance of the primary loop may be unaffected by the secondary structures. Conversely, at a sufficiently high frequency, strong alternating currents (AC currents) may be induced in the secondary structures, which are, by design, forced to flow over a resistance of the secondary structures. This lowers the inductance of the primary loop while introducing significant power dissipation. Thereby, resonance and/or potential resonance in the primary loop is dampened.

Resonance of IC modules may be expressed as a quality factor (Q-factor), which is a dimensionless parameter that describes damping, also known as dampening of a resonator. A Q-factor may be defined as a ratio of a resonator center frequency to its FWHM (Full-Width-half-maximum)-bandwidth when subject to an oscillating driving force. In a distribution, full width at half maximum (FWHM) is the difference between the two values of the independent variable at which the dependent variable is equal to half of its maximum value. In other words, it is the width of a spectrum curve measured between those points on the y-axis which are half the maximum amplitude. A higher Q-factor indicates a sharper resonant response (i.e., narrower bandwidth and more strong amplification), and a lower Q-factor indicates a flatter resonant response (i.e., wider bandwidth and weaker amplification). For example, in a series tuned circuit, the Q-factor increases as resistance R decreases. Hence, a series tuned circuit may incorporate a tuned resistance R (of appropriate value) to dampen (i.e. lower the Q-factor) the resonant response. FWHM-Bandwidth and Q-factor are related, as set forth in the following equation 1:

$$FWMH\text{-}Bandwidth = f2 - f1 = f_R/Q$$

and $$Q = (2\pi \cdot f_R \cdot L)/R \qquad \text{Equation 1}$$

where f2 and f1 are respectively upper and lower cut-off (i.e. half-power) frequencies in hertz, $f_R$ is the resonant frequency in hertz, R is the resistance of a series tuned circuit, and Q is the Q-factor.

FIG. 1 is a circuit diagram of an IC 100, i.e., an integrated circuit, according to some examples. The IC 100 comprises two circuit modules, a first circuit module 104 and a second circuit module 106, which are interconnected by a metal routing. The IC 100 may be produced with a multiple-process technology. For example, the IC 100 may be a mixed-signal IC with the first circuit module 104 comprising mostly analog circuitry and power transistors. and the second circuit module 106 comprising only digital circuit elements. According to another example, the first circuit module 104 could be a power switch that can selectively power down the second circuit module 106, e.g. in a standby operating mode. According to another example, the first circuit module 104 could be a voltage pre-regulator (outputting a voltage less than battery) and the second circuit module 106 could be an LDO (i.e., a Low Drop Out voltage regulator) that is powered by the first circuit module 104, and which is used to supply an external load. Other arrangements and/or configurations of the first circuit module and/or the second circuit module 106 are within the scope of the present disclosure.

The first circuit module 104 is an internal linear voltage regulator circuit including a power pad 108 (VBAT) and a ground pad 110 (GND), according to some examples. In this example, the first circuit module 104 comprises an OTA 115, which is an operational transconductance amplifier, connected to a transistor 117 to provide a regulated power domain voltage (VINT) from the power pad 108. The first circuit module 104 provides the regulated power domain voltage VINT at a power node 112 referenced to a ground node 113, which is electrically connected to the ground pad 110. The first circuit module 104 stabilizes the regulated power domain voltage VINT using a blocking capacitor 114, which may be on-die and has a capacitance of Cblock. According to an alternate example, the blocking capacitor 114 may be off-die and the second circuit module 106 may be on another die. In this case, additional power- and ground pads as well as bond wires (not shown in this figure) would be required. In this case, associated bond-wire inductance and lead-frame inductance may be included in the inductance value Lpwr,loop represented by an inductor 136, set forth in greater detail below. The ESR of the blocking capacitor 114 is represented in the first circuit module 104 as a resistor 116 having a resistance Rblock.

The second circuit module 106 is an arbitrary consumer module, which draws a time-dependent current Imod,eff represented by a current load element 118 across a power node 120 and a ground node 122, according to some examples. The second circuit module 106 has an effective capacitance Cmod,eff represented by a capacitor 124 across the power node 120 and the ground node 122. The ESR of the capacitor 124 is represented by a resistor 126 having a resistance Rmod,eff, which may be due to at least one of local power-routing, MOSFET gate/base contacts, the MOSFET gate material resistance, p/n-well sheet resistance or the ESR of a blocking capacitor that is a part of the second circuit module 106. The capacitance of this blocking capacitor (not shown here) is then a part of capacitance represented by the capacitor 124. Rmod,eff may also be due to other resistive effects internal to the second circuit module 106. Other arrangements and/or configurations of the first circuit module 104 and/or the second circuit module 106 are within the scope of the present disclosure.

According to some examples, the first circuit module 104 and the second circuit module 106 are electrically connected by a power-routing 132 and a ground-routing 134, which form a resonant current loop 130. The power node 112 of the first circuit module 104 and the power node 120 of the second circuit module 106 are connected by the power-routing 132, which is also known as VINT-routing. The ground node 113 of the first circuit module 104 and the ground node 122 of the second circuit module 106 are connected by the ground-routing 134, which is also known as GND-routing. The resonant current loop 130 is formed through a combination of the first circuit module 104, the second circuit module 106, the power-routing 132, and the ground-routing 134. The resonant current loop 130 has the inductance value Lpwr,loop at the resonance frequency represented by the inductor 136. The inductance value Lpwr,loop may include a parasitic inductance of the power-routing 132 and/or a parasitic inductance of the ground-routing 134.

Series resistance comprises ohmic losses in the power-routing 132 and/or the ground-routing 134, and is represented by a resistor 138 having a resistance value Rpwr,loop. The resistance value Rpwr,loop is small in comparison to the impedance of the inductor 136 at the resonance frequency. The resistance value Rpwr,loop of the resistor 138 may also include skin-effect losses and/or substrate eddy current losses or eddy current losses in the metallization or other kinds of RF-losses that scale with the AC-current across inductor 136 (having the inductance value Lpwr,loop), e.g., losses due to eddy currents in other nearby conductors or due to the proximity effect. The skin-effect represents a tendency of an alternating current to become inhomogeneously distributed within a conductor, with a larger current density near the conductor surface and an exponentially decreasing density within the conductor. In other words, current flows mainly at a thin layer near the surface of the conductor, the thickness of which is called skin-depth. Skin-effect losses refer to an increased resistance of the conductor to alternating currents due to the skin effect. Eddy currents in the metallization is another example in which the current distribution of alternating currents is different from the DC current distribution: Here, nearby structures in the IC metallization carry so-called eddy currents, which are currents that flow in closed loops within that nearby structure itself. Eddy current losses in the metallization refer to an increased effective resistance of a conductor to alternating currents due to eddy currents in the nearby metallization. Substrate eddy currents are currents that flow in closed loops inside the substrate, and which are induced in the substrate due to a current flowing in the metallization. Substrate eddy current losses refer to an increased effective resistance of the metallization to alternating currents due to substrate eddy currents.

The power-routing 132 and the ground-routing 134 may exhibit an effective capacitance to each other, which is called Cpwr,sh, and which is represented by the capacitor 140. The effective capacitance Cpwr,sh of the capacitor 140 is connected to a node 141 of the power-routing 132 and a node 143 of the ground-routing 134. The effective capacitance Cpwr,sh may account for capacitances of the power-routing 132 and/or the ground-routing 134 with respect to at least the substrate of the IC 100, other metal layers of the IC 100, directly between the power-routing 132 and the ground-routing 134, e.g., a stray capacitance. The effective capacitance Cpwr,sh may account for other stray capacitances to other conductors nearby. The ESR of the capacitor 140 is denoted by Rpwr,sh and is represented by a resistor 142. The ESR of the capacitor 140 may account for substrate-resistivity, a sheet resistance of other metal layers of the IC 100, a dielectric loss tangent of an isolating oxide, and/or other RF-losses that scale with the AC-current across Cpwr,sh. An isolating oxide may be an inter-metal dielectric used to insulate interconnects on the same level and/or interconnects on different levels. According to an example, the power-routing 132 includes a power-routing section 132a connected between power node 112 and node 141, a power-routing section 132b connected between node 141 and inductor 136, and a power-routing section 132c connected between resistor 138 and power node 120. Ground-routing 134 includes a ground-routing section 134a connected between ground node 122 and node 143, and a ground-routing section 134b connected between node 143 and ground node 122.

The power-interconnect between two modules, e.g., power-routing 132 and ground-routing 134, including Lpwr,loop, Rpwr,loop, Rpwr,sh and Cpwr,sh, and also including any pickup loops (if present), can be regarded as a 2-port network, i.e., an electrical sub-system having two ports. For electrically small power interconnect, the complex series impedance Zser(f) is defined as the impedance at the first port (e.g., corresponding to the first circuit module 104) while the second port (e.g., corresponding to the second circuit module 106) is shorted. A power interconnect that is electrically large between two modules (e.g., the power-routing 132 and the ground-routing 134) can be regarded as an inhomogeneous transmission line. A transmission line may be characterized with parameters of Resistance (R) per length, Inductance (L) per length, Capacitance (C) per length, and Conductance (G) per length, known as RLCG parameters. Here, the complex series impedance Zser(f) is defined in terms of transmission line RLCG parameters, as set forth in the following equation 2:

$$Zser(f)=R(f)+j\cdot\omega\cdot L(f) \qquad \text{Equation 2}$$

where R(f) is a real part of the complex series impedance as a function of the frequency f, and $\omega\cdot L(f)$ is an imaginary part of the complex series impedance as a function of the frequency f.

The series loss tangent, SL=tan δ is equal to the quotient of the real part (i.e., the resistive part) and the imaginary part (i.e., the inductive part) of the complex series impedance Zser(f), as set forth in the following equation 3:

$$SL=\tan\delta=Re(Zser(f))/Im(Zser(f))=R(f)/(\omega\cdot L(f)) \qquad \text{Equation 3}$$

where R(f) is the real part of the complex series impedance as a function of the frequency f, and $\omega\cdot L(f)$ is the imaginary part of the complex series impedance as a function of the frequency f. As set forth by equation 3, the series loss tangent, SL=tan δ, depends on the frequency f. The above series loss tangent may be expressed with reference to the IC 100. The power interconnect between two modules on the IC 100 (e.g., the first circuit module 104 and the second circuit module 106) can be modeled as a two-port network, where the first port and the second port are placed at the first circuit module 104 and at the second circuit module 106, respectively. Each port is attached to the corresponding module's power supply connection (e.g., the power-routing 132), and its reference is the corresponding module's ground connection (e.g., the ground-routing 134).

The characteristics of the resonant current loop 130 are determined by the parameters Cblock, Rblock, Lpwr,loop, Rpwr,loop, Cmod,eff and Rmod,eff, as well as potentially by Cpwr,sh and Rpwr,sh. According to an example, the resistor 116, the resistor 138, the resistor 126, and/or the resistor 142 are parasitic resistors that may be frequency-dependent. The resonant current loop 130 may have a sharp resonance with a Q-factor of at least 1, greater than 1 (e.g., in a range between 1 and 2), greater than 2 (e.g., in a range between 2 and 5), greater than 5 (e.g., in a range between 5 and 10), or greater than 10 (e.g., in a range between 10 and 50). In some examples, the Q-factor may be very high, e.g., greater than 50, greater than 100, or even much greater than 100.

According to some examples, the IC 100 includes a pickup loop 144, which is a structure inductively coupled to the resonant current loop 130. The pickup loop 144 may have a series resistance, represented by a pickup loop resistor 148 having a series resistance value Rm4,loop, tuned to increase the series loss tangent, which depends on frequency. The pickup loop 144 may have a series resistance value Rm4,loop tuned to generate losses at a resonant frequency of resonant current loop 130. The pickup loop 144 is inductive and has an inductance value Lm4,loop, represented by a pickup loop inductor 146. According to an example, the pickup loop 144 can be floating such that the pickup loop 144 is not connected to ground (e.g., not connected to the ground pad 110) and is not connected to power domain voltage VINT (e.g., is not connected to power domain voltage VINT at power node 112). According to another example, the pickup loop 144 is connected to ground at the ground pad 110 by way of the ground node 150. According to another example, the pickup loop 144 is connected to ground at the ground pad 110, the power pad 108 (VBAT), or the power node 112 (VINT) (or some other internal power or ground node) via some other path, possibly including one or more resistors. This serves the same purpose, namely to keep the potential of the pickup loop well-defined. According to various examples, the pickup loop 144 may be included in a set of electrically isolated or electrically connected pickup loops. The set of pickup loops and/or individual pickup loops within the set may be connected to the power pad 108 (VBAT) or the power node 1112 (VINT) (or some other internal power or ground node).

According to some examples, the pickup loop 144 includes a node 152 or a plurality of nodes 152. The pickup loop 144 may be cut at the node 152, e.g., using a focused ion beam (FIB) cut. According to an example, the pickup loop 144 may be introduced in the form of a conservative safety measure for the IC 100, e.g., if the presence of a relevant resonance is expected or cannot be ruled out, and if an estimate of the resonance frequency is available. The pickup loop 144 may be provided with comparatively little metal, and may be placed in readily available free space in available interconnect layers. When the pickup loop 144 is included as a conservative safety measure, testing may be provided post fabrication. Specifically, if RF immunity and/or RF emissions do not change after cutting a pickup loop (e.g., at the node 152), the cut pickup loop may be removed in a next design step.

According to another example, one or a plurality of circuit elements may be added to the pickup loop 144 at the node 152. One or more circuit elements, such as a resistor or a capacitor, may be added to tune the pickup loop 144 at the resonance frequency. For example, a resistor device formed from multiple polysilicon strips or doped silicon may be inserted at the node 152, such that it is electrically connected in series with the inductance value Lm4,loop (represented by the pickup loop inductor 146), in order to tune the pickup loop 144 to generate losses at a resonant frequency of the resonant current loop 130. In another example, a capacitor device, e.g., a polysilicon/oxide/substrate-capacitor or a metal-insulator-metal-capacitor, may be inserted at the node 152, such that it is electrically connected in series with the inductance value Lm4,loop (represented by the pickup loop inductor 146), which may allow to introduce a resonance in the pickup loop 144, and which thereby may allow to increase the series loss tangent further. In an example, the one or more circuit elements are connected at the node 152 as part of an original design. In another example, the one or more circuit elements are located on-die and unconnected, which may be denoted as spare devices or dummy devices. Testing, such as RF immunity testing, may suggest the presence of a heretofore unknown resonant current loop, and e.g., subsequent investigations may then pinpoint the location of this previously unknown resonant current loop. In another example, testing may indicate that the resonant current loop 130 is quantitatively or qualitatively different than expected, e.g., in terms of the resonance frequency or in terms of the precise location of the resonant current path. In such cases, the metallization can be changed by design to connect or disconnect the one or more spare circuit elements or circuit elements, respectively, at the node 152 in order to tune the pickup loop 144 at the resonant frequency. Alternatively, in such cases, changes of the metallization may be designed to change the location or shape of the pickup loop 144, e.g., in order to improve the inductive coupling of the pickup loop 144 to the resonant current loop 130, or in order to tune the pickup loop's series resistance value Rm4,loop to generate losses at the resonant frequency. Alternatively, in such cases, changes of the metallization may be designed to add e.g., one or multiple new pickup loop(s) akin to pickup loop 144. Such changes of the metallization, as put forward in the examples above, may be realized by re-designing only a few metal- and/or via-photomasks, which is also known as a metal-fix. Chips or test chips that incorporate a metal-fix may be manufactured with a small turnaround-time and at a comparatively low cost from wafers that were put on hold before back-end-of-line (BEOL) processing. In another example, one or more nodes 152 in the pickup loop 144 are provided as connection points for off-die circuit elements to tune the pickup loop 144 at the resonant frequency. Other arrangements and/or configurations of the pickup loop 144 are within the scope of the present disclosure.

The pickup loop inductor 146 (with inductance value Lm4,loop) is inductively coupled to the inductor 136 (with inductance value Lpwr,loop), with an inductive coupling coefficient Kappa (K). For inductive coupling, such as between the pickup loop inductor 146 and the inductor 136, the inductive coupling coefficient K is set forth in the following equation 4:

$$K = \frac{Lm}{\sqrt{L1 \cdot L2}} \quad \text{Equation 4}$$

where Lm is the mutual inductance between the two coupled inductors, L1 is the inductance of a first inductor (e.g., inductance value Lm4,loop of the pickup loop inductor 146), and L2 is the inductance of a second inductor (e.g., inductance value Lpwr,loop of the inductor 136). In view of the above, K=1 for an idealized coupling when magnetic flux produced by one inductor (e.g., the pickup loop inductor 146) is ideally coupled to a second inductor (e.g., the inductor 136). A value of K=1 or a value of K approaching 1 may be known as tight coupling. A value of K=0 corresponds to an absence of coupling when magnetic flux produced by one inductor is not coupled to a second inductor. A value of K=0 may be known as uncoupled.

According to an example, the inductor 136 and the pickup loop inductor 146 may be coupled with an inductive coupling coefficient K. Any non-zero inductive coupling coefficient K dampens the resonance of the resonant current loop 130 (i.e., reduces the Q-factor of the resonant current loop 130), in accordance with aspects of the present disclosure. An inductive coupling coefficient K greater than 0.25 may significantly reduce the Q-factor. An inductive coupling coefficient K greater than 0.25 between the resonant current loop 130 and the pickup loop 144 may significantly dampen the resonance of the resonant current loop 130. An inductive coupling coefficient K greater than 0.25 to at most 0.5 may reduce the Q-factor better than an inductive coupling coefficient K of 0.25. An inductive coupling coefficient K greater than 0.5 to at most 0.9 may reduce the Q-factor better than an inductive coupling coefficient K of 0.5. An inductive coupling coefficient K about 0.9 (e.g., greater than 0.85 and to at most 1) may reduce the Q-factor better than an inductive coupling coefficient K of 0.5. An inductive coupling coefficient K as set forth above (e.g., about 0.9) may dampen resonance in the resonant current loop 130 whether the pickup loop 144 is floating or not floating (e.g., connected to power or ground).

For magnetically-coupled non-resonant or resonant power transfer between two loops, such as a non-resonant/resonant first loop LOOP1 and a non-resonant/resonant second loop LOOP2, the efficiency of power transfer is improved if the inductive coupling coefficient K between LOOP1 and LOOP2 is increased. By definition, the inductive coupling coefficient K is related to the mutual inductance between LOOP1 and LOOP2, denoted by Lm, as set forth by equation 4 above. In this equation, L1 is the self-inductance of LOOP1 and L2 is the self-inductance of LOOP2. As a consequence of Faraday's law of induction, the mutual inductance Lm is related to the magnetic flux inside the loop area of LOOP2, which is denoted by $\Phi_{1,2}$, when LOOP1 is excited by a current of I1, as set forth by the following equation 5:

$$Lm = \frac{\Phi_{1,2}}{I1} \qquad \text{Equation 5}$$

Moreover, the inductance of LOOP1 is related to the magnetic flux inside the loop area of LOOP1, which is denoted by $\Phi_{1,1}$, when LOOP1 is excited by a current of I1, as set forth by the following equation 6:

$$L1 = \frac{\Phi_{1,1}}{I1} \qquad \text{Equation 6}$$

In some cases it is appropriate to approximate $\Phi_{1,1}$ as being proportional to the l-th power of the area of LOOP1, where l is between 0.5 and 1.0. For example, if LOOP1 and LOOP2 are formed from single or multiple windings, as in the resonant current loop 130 and the pickup loop 144, this approximation may be applicable. Likewise, it may be appropriate to approximate $\Phi_{1,2}$ as the n-th power of area INTERSECTION12, where n is between 0.5 and 1.0. Here, the area INTERSECTION12 is defined as the intersection of the area of LOOP1 with the area of LOOP2, when viewed in a vertical projection. The following equations follow from equation 5 and equation 6, together with the approximations described above, to form equations 7, 8 and 9 as follows:

$$L1 \propto (A_{LOOP1})^l \qquad \text{Equation 7}$$

$$L2 \propto (A_{LOOP2})^m \qquad \text{Equation 8}$$

$$Lm \propto (A_{INTERSECTION12})^n \qquad \text{Equation 9}$$

where l, m, m are constants between 0.5 and 1.0, which depend on the shape and the layout of the coils, and where $A_{LOOP1}$, $A_{LOOP2}$ and $A_{INTERSECTION12}$ are the areas of LOOP1, LOOP2 and INTERSECTION12, respectively. Under the approximation l=m=n, which may be appropriate if LOOP1 and LOOP2 have a similar shape and layout, and by substituting equation 7, equation 8, and equation 9 into equation 4, K may be approximated according to equation 10 as follows:

$$K \propto \left( \frac{A_{INTERSECTION12}}{\sqrt{A_{LOOP1} \cdot A_{LOOP2}}} \right)^l \qquad \text{Equation 10}$$

From equation 10, the following upper bound on K can be derived according to equation 11 as follows:

$$K < \text{const} \cdot (A_{QUOTIENT})^l \qquad \text{Equation 11}$$

The area overlap quotient $A_{QUOTIENT}$ as may be defined according to equation 12 as follows:

$$A_{QUOTIENT} := \frac{A_{INTERSECTION12}}{\max(A_{LOOP1}, A_{LOOP2})} \qquad \text{Equation 12}$$

Assuming that $A_{LOOP1} > A_{LOOP2}$, e.g., as in LOOP1 being the resonant current loop 130 and LOOP2 being a pickup loop 144 that does not fully cover the area of resonant current loop 130, the area overlap quotient can also be defined according to equation 13 as follows:

$$A_{QUOTIENT} = \frac{A_{INTERSECTION12}}{A_{LOOP1}} \qquad \text{Equation 13}$$

In accordance with aspects of the present disclosure, an area overlap quotient $A_{QUOTIENT}$ greater than 0.25 between the resonant current loop 130 and the pickup loop 144 provides significant inductive coupling. In other words, according to equation 13, significant inductive coupling is provided if the intersection of the pickup loop 144 with the resonant current loop 130 (i.e., in a vertical projection) is larger than 25% of the area of the resonant current loop 130. Inductive coupling scales with the area overlap quotient $A_{QUOTIENT}$ or with a power of the overlap quotient $A_{QUOTIENT}$. In an example, inductive coupling is provided when the area of the pickup loop 144 is less than or equal to 25% of the area of the resonant current loop 130. In another example, inductive coupling is significantly increased when the area of the pickup loop 144 is greater than 50% of the area of the resonant current loop 130, and when the pickup loop 144 is completely inside the resonant current loop 130 as viewed in a vertical projection (i.e., when the area overlap quotient $A_{QUOTIENT}$ is greater than 0.5). In an example, the first area $A_{LOOP1}$ of the resonant current loop 130 is fixed according to a design of the IC 100. The second area $A_{LOOP2}$ of the pickup loop 144 is then arranged to follow the first area $A_{LOOP1}$ to increase the area overlap quotient $A_{QUOTIENT}$ and hence the inductive coupling coefficient K.

The pickup loop 144 and the resonant current loop 130 may be physically arranged in the IC 100 to provide and/or enhance inductive coupling. In other words, the pickup loop 144 and the resonant current loop 130 may be physically arranged to increase the inductive coupling coefficient K, which is achieved by increasing the area overlap quotient $A_{QUOTIENT}$. According to an example, the pickup loop 144 and the resonant current loop 130 may be formed horizontally adjacent in the same metal layer as the resonant current loop 130. According to another example, the pickup loop 144 and/or the resonant current loop 130 include sections that are horizontally and/or vertically off-set. According to yet another example, the pickup loop 144 and/or the resonant current loop 130 comprise a plurality of electrically connected pickup loops connected in series, which may also be known as windings. The combination of the resonant current loop 130 and the pickup loop 144 may also be regarded as a transformer. In this case, the multiple windings of the pickup loop 144 or the multiple windings of the resonant current loop 130, respectively, contribute to the area spanned by the pickup loop 144 (i.e., the secondary loop area $A_{LOOP2}$) or the area of the resonant current loop 130 (i.e., the primary loop area $A_{LOOP1}$), respectively, in the sense that the area of the pickup loop is then defined as the union of the areas of all its windings in a vertical projection rather than the sum of the winding areas. For example, in a pickup loop 144 with two windings, where the second winding is completely contained inside the first winding as viewed in a vertical projection, the area of the pickup loop is equal to the area of its outer-most, i.e., first winding, rather than the sum of the areas of the first and second winding. In a pickup loop or in a resonant current loop with multiple windings, the area overlap quotient $A_{QUOTIENT}$ between the resonant current loop 130 and the pickup loop 144 may be calculated according to the definition of a loop area with multiple windings described in this paragraph. Other configurations and/or arrangements of the pickup loop 144 and elements inducing the resonant current loop 130 are within the scope of the present disclosure.

According to aspects of the present disclosure, an inductance value Lm4,loop of the pickup loop inductor 146 may be equal or equivalent to the inductance value Lpwr,loop of the resonant current loop 130. A series resistance value Rm4,loop of the pickup loop resistor 148 may be significantly larger than a resistance value Rpwr,loop of the resistor 138. The series resistance value Rm4,loop may be tuned to roughly match the impedance of the pickup loop inductor 146 (i.e., the reactance that arises from the inductance value Lm4,loop) at the resonance frequency of the resonant current loop 130 multiplied by a correction factor. In an example, a correction factor may be sqrt(1−K^2), where K is the inductive coupling coefficient between the pickup loop 144 and the resonant current loop 130. Resistance of the pickup loop 144 is proportional to the reciprocal of the interconnect layout width in a metal layer or an interconnect layer. The interconnect layout width may vary for different sections of the pickup loop 144, resulting in an effective series resistance value Rm4,loop that is the sum of the individual segments' resistances. Moreover, the pickup loop 144 may contain one or multiple resistor devices in the loop, which also contribute to the series resistance value Rm4,loop. The series resistance value Rm4,loop of the pickup loop resistor 148 may be tuned by varying interconnect layout width of the pickup loop 144 or varying interconnect layout width of a section of the pickup loop 144, or by inserting one or multiple resistor devices into the pickup loop 144. According to an example, the pickup loop 144 is a dissipative structure that dissipates energy on a rather large frequency interval. The rather large frequency interval may permit an approximation of a tuned series resistance value Rm4,loop of the pickup loop resistor 148.

According to some examples, values of Rm4,loop>Rpwr,loop dampen resonance in the resonant current loop 130. Values of Rm4,loop>1.5×Rpwr,loop may significantly dampen resonance in the resonant current loop 130. According to another example, the series resistance value Rm4,loop is tuned to an absolute value of the electrical reactance of the pickup loop inductor 146 (having the inductance value Lm4,loop) at the resonance frequency of the resonant current loop 130 multiplied by a correction factor of sqrt(1−K^2), where K is the inductive coupling coefficient between the pickup loop 144 and the resonant current loop 130. The electrical reactance $X_L$ is set forth by the following equation 14:

$$X_L = 2\cdot\pi\cdot j \cdot f_R \cdot L \qquad \text{Equation 14}$$

where $f_R$ is the resonance frequency of the resonant current loop 130 and L is the inductance of a loop. Thus, the pickup loop inductor 146 has an electrical reactance Zm4,loop, ind=2·π·j·$f_R$·Lm4,loop at the resonance frequency $f_R$. Hence, the series resistance value Rm4,loop is tuned to sqrt(1−K^2)·|Zm4,loop,ind| to dampen the resonance of the resonant current loop 130 at the resonance frequency $f_R$ of the resonant current loop 130, where K is the inductive coupling coefficient between the pickup loop 144 and the resonant current loop 130. According to aspects of the present disclosure, the series resistance value Rm4,loop is tuned in a range of 0.1·sqrt(1−K^2)·|Zm4,loop,ind| to 10·sqrt(1−K^2)·|Zm4,loop,ind| to dampen resonance of the resonant current loop 130. Tuning the series resistance value Rm4,loop closer to sqrt(1−K^2)·|Zm4,loop,ind| may provide increased dampening of the resonance.

According to an example, with an inductive coupling coefficient K=0.9 and a tuned series resistance value Rm4,loop=sqrt(1−0.9^2)·|Zm4,loop,ind|=0.436×|Zm4,loop,ind|, the pickup loop 144 may rotate a phase of the RF series impedance of the resonant current loop 130 by almost 45°. In this case, the Q-factor of the resonance in the resonant current loop 130 may decrease to less than a value of 1. An exact value of a decrease in the Q-factor may depend on additional losses such as Rpwr,sh, Rmod,eff, Rblock, and/or other losses. According to an example, a phase-rotation beyond 45° may be provided by closing the pickup loop 144 with a capacitor (not shown), or by improving the inductive coupling between the pickup loop and the resonant current loop beyond K=0.9, e.g., to K=0.95. A reduction of kappa beyond 0.9 might be implemented by placing the pickup loop or the secondary structure directly below/above the resonant current loop, with a very small vertical separation, e.g., a vertical separation of less than 300 nanometers (nm) might be sufficient to achieve K>0.9, assuming the horizontal width of the metal interconnect, from which the resonant current loop is formed, is roughly 20 micrometers (um).

The pickup loop 144 may be used in combination with values of Rpwr,sh, Rmod,eff, and/or Rblock. For example, a design increase in the resistance value Rpwr,loop may reduce the Q-factor of resonant current loop 130, but this approach may have disadvantages as follows. A design increase in the resistance value Rpwr,loop may increase a static/dynamic voltage drop across the second circuit module 106, i.e., between the power node 120 and the ground node 122. In a particular example, a design of a 20 Ohm resistance value Rpwr,loop may dampen a resonance at 1 GHz over a 3 nanohenry (nH) inductance to a Q-factor of 1. If the second circuit module 106 draws 10 milliamps (mA) at DC, an unacceptable DC voltage drop of 200 millivolts (mV) across the power node 120 and the ground node 122 may be present. In contrast, the pickup loop 144 does not introduce an unacceptable DC voltage drop across the power node 120 and the ground node 122 of the second circuit module 106.

According to another example, a design change to the blocking capacitor 114 may increase in resistance Rblock (i.e., represented by the resistor 116) and thereby dampen the resonance in the resonant current loop 130, but this approach may have disadvantages. Rblock is the ESR of the blocking capacitor 114. A design using a 20 Ohm value for Rblock may introduce high-frequency losses in the resonant current loop 130 with minimal, negligible, and/or non-existent DC voltage drop across the power node 120 and the ground node 122 of the second circuit module 106. A 20 Ohm value for Rblock is suitable to dampen the resonance at 1 GHz in the resonant current loop 130 with an effective capacitance $(1/Cblock+1/Cmod,eff)^{-1}$ of 8 picofarads (pF). However, in an example assuming Cblock=70 pF and Cmod,eff=9 pF, this then may reduce the corner frequency of Cblock to roughly 100 MHz. This example may be undesirable for RF emissions caused by Imod,eff at a frequency f>100 MHz. In contrast and according to an example, introduction of the pickup loop 144 will not diminish the RF-blocking capability of Cblock. According to another example, a design change to increase Rmod,eff may dampen the resonance in the resonant current loop 130, but this approach may have disadvantages. Rmod,eff is the ESR of the capacitor 124 represented by the resistor 126. Rmod,eff may not be changeable due to an implementation of the second circuit module 106. Rmod,eff may relate to an effective capacitance arising from a collection of MOSFETs in the second circuit module 106 and an increase in Rmod,eff may introduce local power-routing losses in the second circuit module 106. In this case, an unacceptable DC voltage drop may be introduced across the power node 120 and the ground node 122 of the second circuit module 106. The pickup loop 144 will not introduce a DC voltage drop and/or may introduce a negligible DC voltage drop across power node 120 and ground node 122 of second circuit module 106.

Figure 2A:
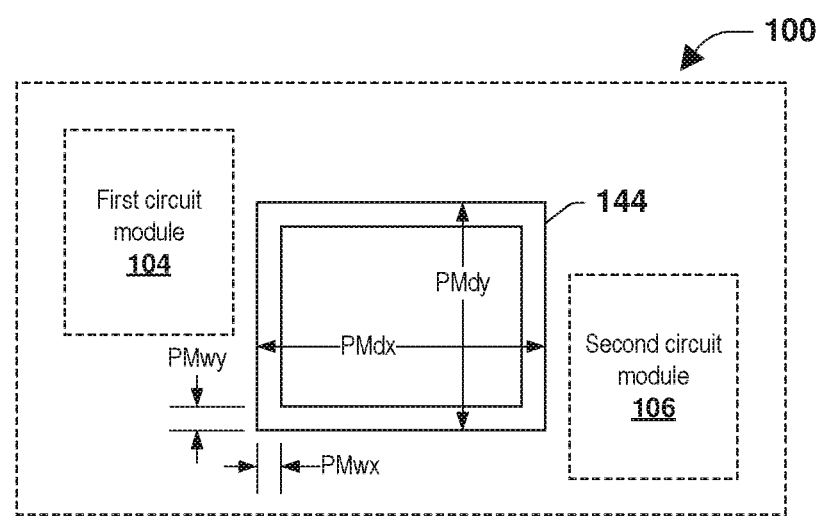
FIGS. 2A and 2B are top-down and sectional views of an integrated circuit including a pickup loop, according to some examples.
Figure 2B:
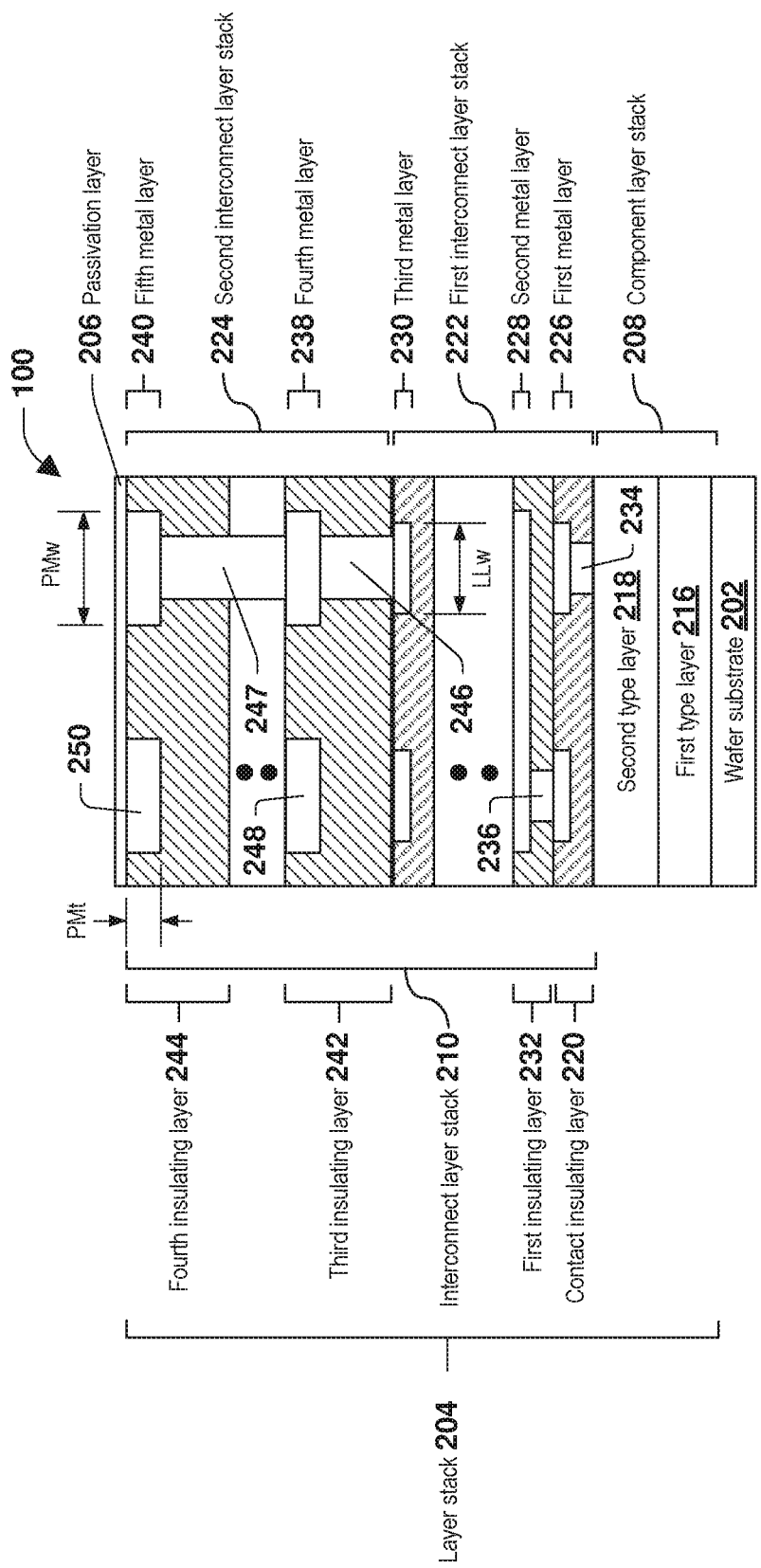

FIGS. 2A and 2B are top-down and sectional views of IC 100 including the pickup loop 144, according to some examples. FIG. 2A illustrates a top-down view of the pickup loop 144 between the first circuit module 104 and the second circuit module 106. The pickup loop 144 is floating and not connected to ground. The pickup loop 144 has an outer x-axis (e.g., horizontal) dimension PMdx and an outer y-axis (e.g., vertical) dimension PMdy. In an example where the pickup loop 144 is the second loop LOOP2, set forth above with reference to equations 7-13, the second area $A_{LOOP2}$ is given by a product of the outer x-axis dimension PMdx and the outer y-axis dimension PMdy. The outer x-axis dimension PMdx and the outer y-axis dimension PMdy may vary in accordance with different examples. In an example where the pickup loop 144 is non-rectangular, the second area $A_{LOOP2}$ is approximated by an area determined from an outer periphery of the pickup loop 144 in a top-down view.

The pickup loop 144 has an x-axis width PMwx and a y-axis width PMwy. In an example, the x-axis width PMwx equals the y-axis width PMwy. In another example, each of the dimensions PMwx and PMwy might not be constant and vary across the loop's circumference. The x-axis width PMwx and/or the y-axis width PMwy may be varied to change the series resistance value Rm4,loop, represented by the pickup loop resistor 148. Segments or sub-segments of the pickup loop 144 may be varied in the x-axis width PMwx and/or the y-axis width PMwy to change the series resistance value Rm4,loop. According to another example, the pickup loop 144 might not be rectangular and contains an arbitrary number of sections, which reside in different metal layers and are interconnected by vias. Other arrangements and/or configurations of the dimensions of the pickup loop 144 are within the scope of the present disclosure.

FIG. 2B illustrates a sectional view of the IC 100, according to some examples. The IC 100 is formed in layers and includes a wafer substrate 202, a layer stack 204 formed on the wafer substrate 202, and a passivation layer 206 formed on the layer stack 204. The layer stack 204 comprises a component layer stack 208 and an interconnect layer stack 210. The interconnect layer stack 210 further comprises a first interconnect layer stack 222 and a second interconnect layer stack 224. According to an example, the first interconnect layer stack 222 is a local interconnect layer stack providing local power-routing within a circuit module of the IC 100 (e.g., the first circuit module 104 or the second circuit module 106). According to another example, the first interconnect layer stack 222 may provide power-routing between circuit modules of the IC 100 (e.g., the first circuit module 104 or the second circuit module 106). According to an example, the second interconnect layer stack 224 is a global interconnect layer stack providing global power-routing (e.g., low-ohmic power metal interconnect) between the circuit modules of the IC 100. According to another example, the second interconnect layer stack 224 may provide local power-routing within a circuit module of the IC 100. According to another example, the interconnect layer stack 210 provides at least one of local power-routing or global power-routing in one or a plurality of layers. Other arrangements and/or configurations of the first interconnect layer stack 222 and the second interconnect layer stack 224 are within the scope of the present disclosure.

According to some examples, the component layer stack 208 is fabricated on the wafer substrate 202 and realizes electronic components, such as transistors, thyristors, capacitors, resistors or diodes. The component layer stack 208 may be fabricated in a process including photolithography, deposition (such as chemical vapor deposition), and/or etching, which may be supplemented by doping and cleaning. The component layer stack 208 may include DMOS transistors, Bipolar transistors, Low-voltage CMOS devices, diodes such as electrostatic discharge (ESD) diodes, thyristors, and/or other components. The component layer stack 208 may include a first type layer 216, such as a silicon layer doped with a first type impurity, and a second type layer 218, such as a silicon layer doped with a second type impurity. According to some examples, the first type layer 216 is at least one of an N-buried layer, a P-buried layer, one or multiple rather highly n- or p-doped buried layers, or a buried oxide layer adjacent to the wafer substrate 202, or another type of layer. The first type layer 216 may also include one or multiple kinds of p- or n-wells, which may also be contained in each other (e.g., as in "triple well"). The first type layer 216 may also include n- or p-type sinkers that allow contact with buried layers or wells. The first type layer 216 may also include additional implants and/or technology-specific structures needed to realize semiconductor devices, such as ESD-diodes, DMOS-transistors, Bipolar transistors, CMOS-devices, thyristors, diodes, etc. A contact insulating layer 220 is formed on top of the component layer stack 208. The contact insulating layer 220 is an inter-metal dielectric layer that contains a plurality of electric through-connections between the component layer stack 208 and the interconnect layer stack 210, which are also known as contacts or vias. For example, first via 234 is an electric through-connection formed in the contact insulating layer 220. Fabrication of the component layer stack 208 may be known as front-end-of-line (FEOL) processing. The contact insulating layer 220 may also be fabricated during FEOL processing. Other arrangements and/or configurations of the first type layer 216, the second type layer 218, and/or the contact insulating layer 220 are within the scope of the present disclosure.

The interconnect layer stack 210 may be formed on the component layer stack 208. Fabrication and stacking of adjacent metal and insulating layers on top of the component layer stack 208 (e.g., the first interconnect layer stack 222 and the second interconnect layer stack 224) may be known as back-end-of-line (BEOL) processing. Interconnect layers in the first interconnect layer stack 222, may also be known as metal layers or thin-metal layers, may be highly structured in layout, and/or may vary in number (e.g., 2 to 15) depending upon fabrication technology. Interconnect layers of the interconnect layer stack 210 are also known as metallization layers and/or metal layers, with each interconnect layer separated and surrounded by an insulating layer. The interconnect layers of the interconnect layer stack 210 comprise interconnect, also known as wiring, to electrically connect electronic components of the component layer stack 208, modules of the IC 100, and other interconnect layers. The interconnect layers may be electrically connected by way of contacts or vias (e.g., holes in an insulating layer filled with conductive material such as metal).

According to an example, the interconnect layers of the interconnect layer stack 210 are numbered sequentially in an order of fabrication, that is from bottom to top in FIG. 2B (e.g., Metal-1 (M1), Metal-2 (M2), etc.). Insulating layers, may also be known as via layers, inter-level dielectric (ILD) layers, or inter-metal dielectric layers, are also numbered sequentially in order of fabrication, from top of the first metal layer (Metal-1) to a top insulating layer (e.g., Via-1 (V1), Via-2 (V2), etc.). In an example, a Smart Power IC has between 1 to 6 metal layers. In an example, the interconnect layers of the interconnect layer stack 210 comprise a single type of material, such as a single metal type. Other arrangements and/or configurations of the interconnect layer stack 210 are within the scope of the present disclosure.

The first interconnect layer stack 222 comprises a plurality of metal layers, such as a first metal layer 226, a second metal layer 228, a third metal layer 230, etc., according to some examples. Each metal layer has a corresponding insulating layer which separates a metal layer from another metal layer. For example, a first insulating layer 232 surrounds the second metal layer 228 and separates the second metal layer 228 from the first metal layer 226. The first interconnect layer stack 222 includes a plurality of vias to electrically connect the metal layers and to electrically connect the first interconnect layer stack 222 to the component layer stack 208. For example, the first via 234 electrically connects the first metal layer 226 to the component layer stack 208 and a second via 236 electrically connects the second metal layer 228 to the first metal layer 226. Typically, the first metal layer 226 has smaller dimensions than other layers in the interconnect layer stack 210. Typically, interconnect in the first interconnect layer stack 222 is thin, short in length, and closely arranged, while interconnect in the second interconnect layer stack 224 is thick, long, and widely separated. Interconnect in the first interconnect layer stack 222 may be designed to vary in width depending upon connected components and to vary in resistance depending upon width. Interconnect in the first interconnect layer stack 222 has a minimum width LLw, set forth by a fabrication technology (e.g., widely varying between 0.04 um and 10.0 um depending upon fabrication technology design rules). Interconnect widths are expected to decrease with advances in fabrication technologies. According to some examples, interconnect widths in the first interconnect layer stack 222 may be varied (e.g., greater than the minimum width LLw) to tune the series resistance value Rm4,loop and/or the inductance value Lm4,loop of the of the pickup loop 144 at the resonance frequency of the resonant current loop 130. Other arrangements and/or configurations of the first interconnect layer stack 222 are within the scope of the present disclosure.

The second interconnect layer stack 224 comprises a plurality of metal layers, such as a fourth metal layer 238 and a fifth metal layer 240, according to some examples. Each metal layer has a corresponding insulating layer, which separates a metal layer from another metal layer. For example, a third insulating layer 242 surrounds interconnect of the fourth metal layer 238 and separates the fourth metal layer 238 from the third metal layer 230. For example, a fourth insulating layer 244 surrounds interconnect of the fifth metal layer 240 and separates the fifth metal layer 240 from an adjacent metal layer (e.g., the fourth metal layer 238 in the absence of interposed metal layers between the fourth metal layer 238 and the fifth metal layer 240). The second interconnect layer stack 224 includes a plurality of vias to electrically connect the metal layers and to electrically connect the second interconnect layer stack 224 to the first interconnect layer stack 222. For example, a third via 246 electrically connects the fourth metal layer 238 to the third metal layer 230 and a fourth via 247 electrically connects the fifth metal layer 240 to the fourth metal layer 238. Interconnects in the second interconnect layer stack 224 (i.e., as in the first interconnect layer stack 222) may be designed to vary in width depending upon connected components and to vary in resistance depending upon width. According to some examples, interconnects in the second interconnect layer stack 224 have a minimum width PMw greater than a minimum width LLw of the first interconnect layer stack 222, set forth by a fabrication technology. According to some examples, interconnect widths in the second interconnect layer stack 224 may be varied (e.g., greater than the minimum width PMw) to tune the series resistance value Rm4,loop and/or the inductance value Lm4,loop of the pickup loop 144 at the resonance frequency of the resonant current loop 130. Other arrangements and/or configurations of the second interconnect layer stack 224 are within the scope of the present disclosure.

The layer stack 204 includes a plurality of structures, such as a first structure 248 and a second structure 250, according to some examples. According to an example, the first structure 248 may form and/or may form a part of the pickup loop 144 and the second structure 250 may form and/or may form a part of the resonant current loop 130. The first structure 248 may form a part of a section of the pickup loop 144 and the second structure 250 may form a part of a section of an element of the resonant current loop 130 (e.g., the power-routing 132 or the ground-routing 134). According to another example, the second structure 250 may form and/or may form a part of the pickup loop 144 and the first structure 248 may form and/or may form a part of the resonant current loop 130. According to an example, the pickup loop 144 is formed in a single metal layer of the interconnect layer stack 210 (e.g., the fifth metal layer 240, the fourth metal layer 238, etc.). According to an example, the pickup loop 144 is formed in multiple metal layers of the interconnect layer stack 210 (e.g., the fourth metal layer 238 and the third metal layer 230, with an electrical connection provided between the layers by the third via 246). Other arrangements and/or configurations of the first structure 248 and the second structure 250 are within the scope of the present disclosure.

Fabrication technologies have design rules that set forth interconnect parameters that generally may not be waived. For example, dimensions of metal layers in the interconnect layer stack 210 vary greatly depending upon design rules, which may correspond to process technology, type of metal, technology node size, and/or other factors. The design rules set forth interconnect parameters. The interconnect parameters include width, thickness, horizontal spacing (i.e., the distance between interconnect on the same level), vertical spacing (i.e., the distance between interconnect on different levels), pitch (i.e., the sum of the width and spacing), aspect ratio (i.e., the thickness divided by width), and/or other parameters. The design rules may be enforced through design rule checking (DRC), which is a step in physical verification of an IC design. The interconnect parameters (e.g., vertical and horizontal spacing) imply some maximum value for the inductive coupling coefficient K according to fabrication technology. In other words, an inductive coupling coefficient K arbitrarily close to 1 is not possible, and an upper bound to K may be implied by fabrication design rules. According to examples of the present disclosure, a minimum separation distance (e.g., horizontal spacing and/or vertical spacing) between the pickup loop 144 and the resonant current loop 130 is provided, such that the inductive coupling coefficient K is maximized under the constraint that the metal structures are in compliance with fabrication technology design rules. Other arrangements and/or configurations for tuning the pickup loop 144 are within the scope of the present disclosure.

Figure 3A:
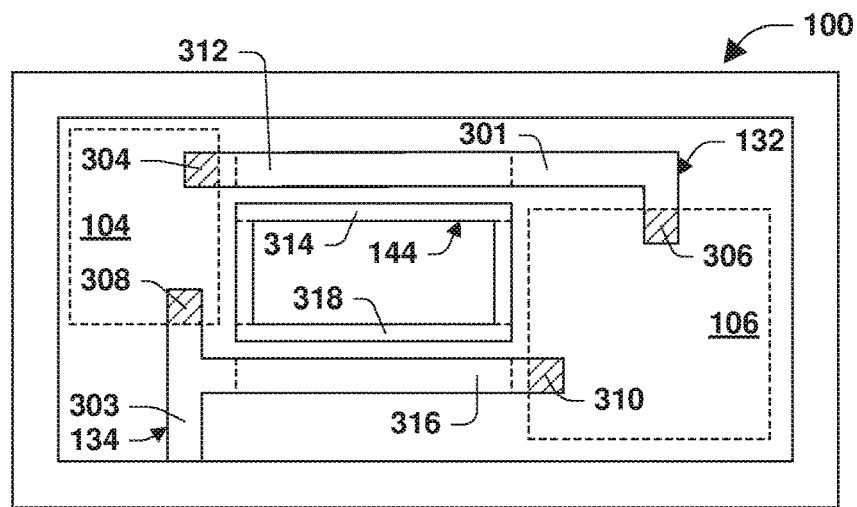
FIGS. 3A-3C are top-down views of an integrated circuit, according to some examples.
Figure 3B:
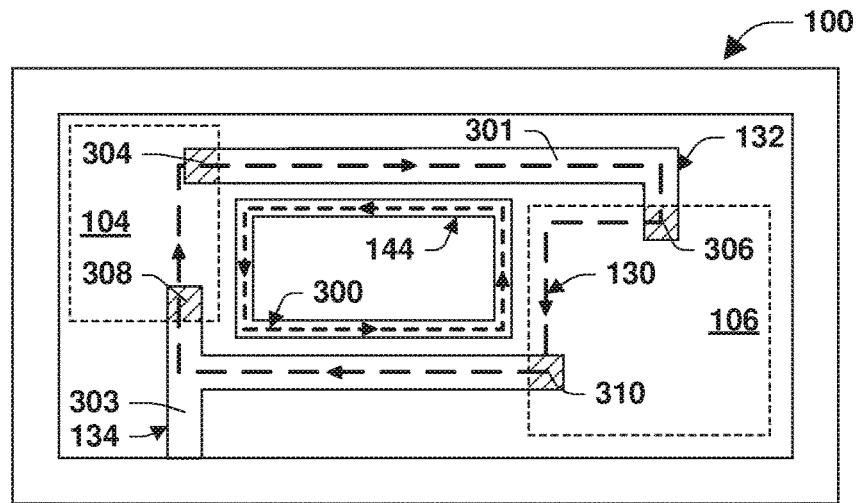
Figure 3C:
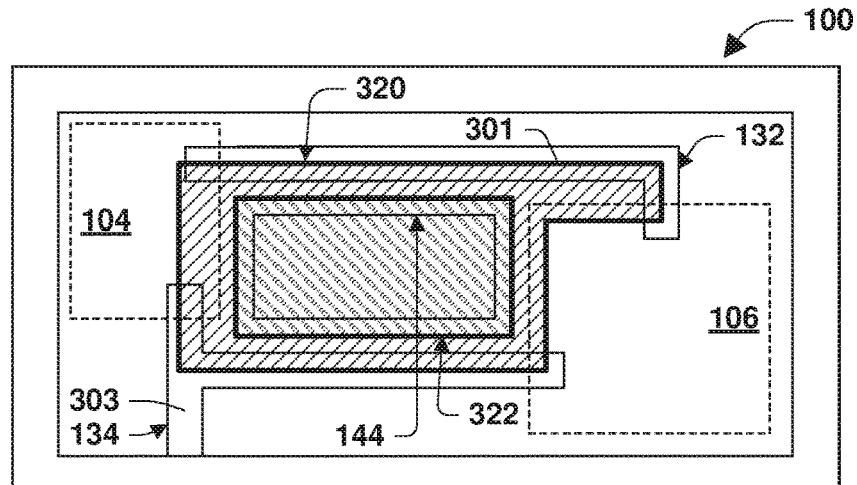

FIGS. 3A-3C are top-down views of the IC 100, according to some examples. FIG. 3A illustrates a layout of the IC 100 including the first circuit module 104, the second circuit module 106, the power-routing 132, the ground-routing 134, and the pickup loop 144. FIG. 3B illustrates the IC 100 of FIG. 3A, which includes the resonant current loop 130. A pickup current loop 300 is induced in the pickup loop 144 in response to the resonant current loop 130. FIG. 3C illustrates areas spanned by the resonant current loop 130 and the pickup current loop 300.

The first circuit module 104 provides the regulated power domain voltage VINT to the second circuit module 106 by way of the power segment 301. The regulated power domain voltage VINT is referenced to ground, e.g., by way of the seal ring 302 and/or the ground-routing 134. The first circuit module 104 stabilizes the regulated power domain voltage VINT as set forth above with reference to FIG. 1. The power-routing 132 comprises a power segment 301 that supplies the power domain voltage VINT from the first circuit module 104 to the second circuit module 106. The ground-routing 134 comprises a ground segment 303 that couples the first circuit module 104 and the second circuit module 106 to ground. In an example, the seal ring 302 is provided in a configuration framing an outer periphery of the layer stack 204 and is electrically connected to the ground segment 303.

The IC 100 includes a seal ring 302 that surrounds and frames the IC 100, the first circuit module 104, and the second circuit module 106, according to some examples. In the illustrated example, the ground-routing 134 comprises the seal ring 302 and the ground segment 303, such that both are coupled to ground. In another example, the ground-routing 134 does not comprise the seal ring 302 such that the seal ring 302 is either not coupled to ground or coupled to ground by some other connection (not shown) and the ground segment 303 is coupled to ground through another connection (not shown). The seal ring 302, also known as a chip seal ring, is a structure to enclose the die of the IC 100 outside of a pad frame and to protect the die from moisture and sawing. According to an example, the interconnect layers of the interconnect layer stack 210 at least one of overlie, contact, electrically couple to, or are formed adjacent to the seal ring 302. According to an example, the seal ring 302 is electrically conductive and comprises at least one of the metal layers and/or at least one of the insulating layers in the interconnect layer stack 210. Other arrangements and/or configurations of the seal ring 302 are within the scope of the present disclosure.

The power segment 301 is illustrated as an example of L-shaped geometric structure. The power segment 301 may be provided as any geometric structure according to fabrication design rules, and may include portions that are linear, piece-wise linear, non-linear, or another geometric shape. The power segment 301 includes a first power section 304, which corresponds to the power node 112 of the first circuit module 104. The power domain VINT is supplied by the first circuit module 104 at the first power section 304 and is conducted along the power segment 301. The power segment 301 includes a second power section 306, which corresponds to the power node 120 of the second circuit module 106. The power domain VINT is received by the second circuit module 106 through the power segment 301 at the second power section 306.

The ground segment 303 is illustrated as an example of a T-shaped geometric structure. The ground segment 303 may be provided as any geometric structure according to fabrication design rules, and may include portions that are linear, piece-wise linear, non-linear, or another geometric shape. The ground segment 303 includes a first ground section 308, which corresponds to the ground node 113 of the first circuit module 104. The ground segment 303 includes a second ground section 310, which corresponds to the ground node 122 of the second circuit module 106. According to the illustrated example, the ground segment 303 is coupled to ground by electrical connection to the seal ring 302. According to another example, the ground segment 303 is coupled to ground by a separate connection (e.g., an external ground pin that is internally connected to the ground pad 110).

In the example illustrated in FIG. 3B, the resonant current loop 130 arises in a physical structure defined by the first circuit module 104, the power-routing 132, the second circuit module 106, and the ground-routing 134. The current of the resonant current loop 130 flows from the first circuit module 104 at the first power section 304, along the power segment 301 from the first power section 304 to the second power section 306, across the second circuit module 106 from the second power section 306 to the second ground section 310, along the ground segment 303 from the second ground section 310 to the first ground section 308, and then across the first circuit module 104 from the first ground section 308 back to the first power section 304.

The pickup loop 144 may be configured and/or arranged according to any of the examples set forth above. In the illustrated example, the pickup loop 144 is floating (e.g., not connected to ground or a regulated power domain). In another example, the pickup loop 144 is connected to ground (e.g., by connection to the ground segment 303 and/or the seal ring 302) or connected to a regulated power domain (e.g., the power segment 301 supplying VINT). In the illustrated example, the pickup loop 144 is provided in the same metal layer as the power segment 301 and the ground segment 303 (e.g., a metal layer in the interconnect layer stack 210). In another example, the pickup loop 144 may be provided in a different metal layer from the power segment 301 and/or the ground segment 303. In another example, the pickup loop 144 may span multiple interconnect layers by way of a plurality of electrically connected sections. In an example, the pickup loop 144 may comprise a plurality of separate continuous pickup loops (e.g., pickup loops that are not electrically connected). In another example, the pickup loop 144 may comprise a plurality of separate continuous pickup loops where one or more separate pickup loops are electrically connected to at least one of ground, a regulated power domain, or another pickup loop.

In the example illustrated in FIG. 3B, the pickup loop 144 may be configured to follow the resonant current loop 130. The power segment 301 includes an induction section 312 and the pickup loop 144 includes an induction section 314 that is horizontally adjacent to and follows the induction section 312. The ground segment 303 includes an induction section 316 and the pickup loop 144 includes an induction section 318 that is horizontally adjacent to and follows the induction section 316. Other arrangements and/or configurations of the pickup loop 144 are within the scope of the present disclosure.

FIG. 3C illustrates a first area 320 spanned by the resonant current loop 130 and a second area 322 spanned by the pickup loop 144. According to an example, the pickup loop 144 is provided with dimensions to (1) maximize the inductive coupling coefficient K, and (2) to tune the series resistance value Rm4,loop of the pickup loop resistor 148, as described above, through flexible routing and layout. For example, the intersection between the first area 320 and the second area 322 is greater than 25% of the first area 320. According to equation 13, when the first area 320 is the first area $A_{LOOP1}$ and the second area 322 is the second area $A_{LOOP2}$, the area overlap quotient $A_{QUOTIENT}$ is greater than 0.25 between the resonant current loop 130 and the pickup loop 144. In view of the above example, the pickup loop 144 is significantly inductively coupled to the resonant current loop 130. Other arrangements and/or configurations of the power-routing 132, the ground-routing 134, and the pickup loop 144 are within the scope of the present disclosure.

Figure 4A:
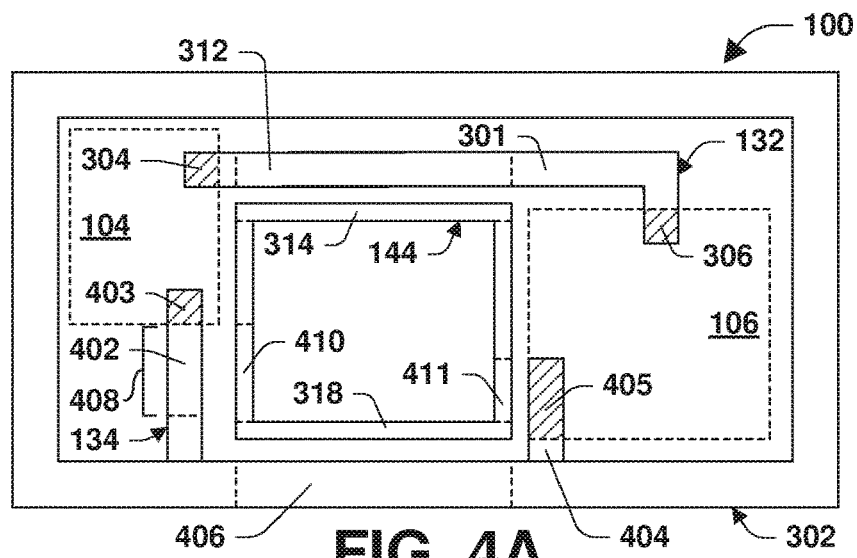
FIGS. 4A-4C are top-down views of an integrated circuit, according to some examples.
Figure 4B:
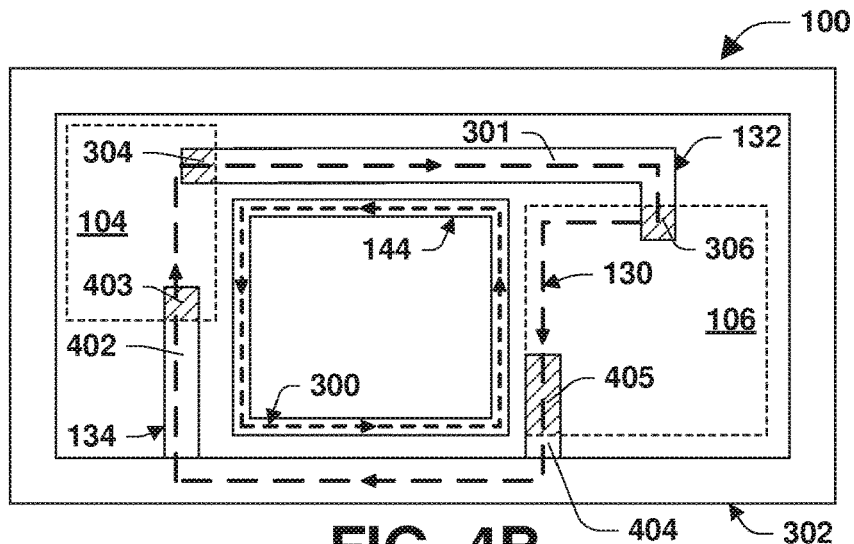
Figure 4C:
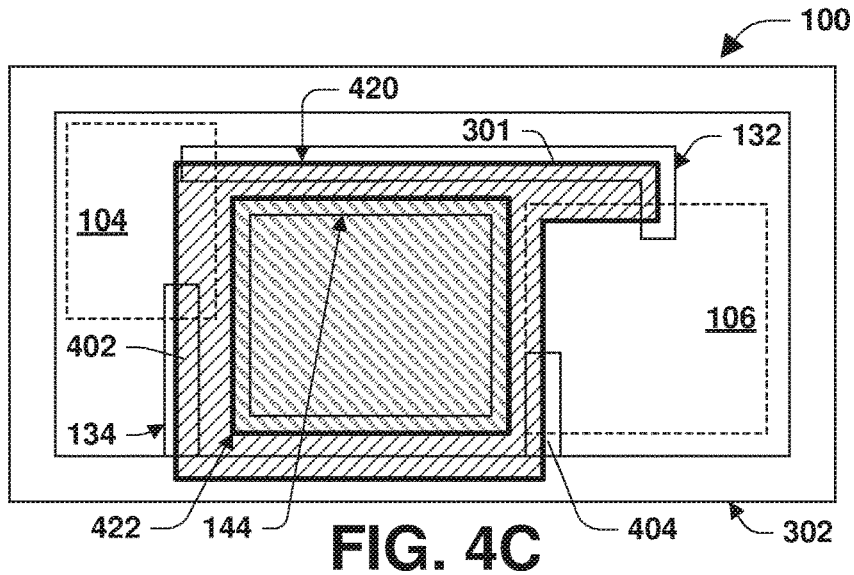

FIGS. 4A-4C are top-down views of the IC 100, according to some examples. FIG. 4A illustrates a layout of the IC 100 including the first circuit module 104, the second circuit module 106, the power-routing 132, the ground-routing 134, the seal ring 302, and the pickup loop 144. FIG. 4B illustrates the IC 100 of FIG. 4A, which includes the resonant current loop 130. The pickup current loop 300 is induced in the pickup loop 144 in response to the resonant current loop 130. FIG. 4C illustrates areas spanned by the resonant current loop 130 and the pickup current loop 300. In this example, the first circuit module 104, the second circuit module 106, the power-routing 132, and the seal ring 302 are the same as in FIGS. 3A and 3B. The seal ring 302 is coupled to ground.

In the example illustrated in FIG. 4A, the ground-routing 134 comprises a first ground segment 402, a second ground segment 404, and the seal ring 302. The first ground segment 402 and the second ground segment 404 are electrically connected to the seal ring 302. The first ground segment 402 and the second ground segment 404 are illustrated as examples of linear geometric structures, and may be provided as any geometric structure according to fabrication design rules. The first ground segment 402 includes a first ground section 403, which corresponds to the ground node 113 of the first circuit module 104. The second ground segment 404 includes a second ground section 405, which corresponds to the ground node 122 of the second circuit module 106.

In the example illustrated in FIG. 4B, the resonant current loop 130 arises in a physical structure defined by the first circuit module 104, the power-routing 132, the second circuit module 106, the second ground segment 404, the seal ring 302, and the first ground segment 402. The current in the resonant current loop 130 flows from the first circuit module 104 at the first power section 304, along the power segment 301 from the first power section 304 to the second power section 306, across the second circuit module 106 from the second power section 306 to the second ground section 405, along the second ground segment 404 from the second ground section 405 to the seal ring 302, along the seal ring 302 from the second ground segment 404 to the first ground segment 402, along the first ground segment 402 from the seal ring 302 to the first ground section 403, and then across the first circuit module 104 from the first ground section 403 back to the first power section 304.

In the example illustrated in FIG. 4B, the pickup loop 144 may be configured to follow the resonant current loop 130. The power segment 301 includes the induction section 312 and the pickup loop 144 includes the induction section 314 that is horizontally adjacent to and follows the induction section 312. The second ground segment 404 includes the second ground section 405 and the pickup loop 144 includes an induction section 411 that is horizontally adjacent to and follows the second ground section 405. The seal ring 302 includes an induction section 406 and the pickup loop 144 includes the induction section 318 that is horizontally adjacent to and follows the induction section 406. The first ground segment 402 includes an induction section 408 and the pickup loop 144 includes an induction section 410 that is horizontally adjacent to and follows the induction section 408.

FIG. 4C illustrates a first area 420 spanned by the resonant current loop 130 and a second area 422 spanned by the pickup loop 144. According to an example, the pickup loop 144 is provided with dimensions to (1) maximize the inductive coupling coefficient K, and (2) to tune the series resistance value Rm4,loop of the pickup loop resistor 148, as described above, through flexible routing and layout. For example, the intersection between the first area 420 and the second area 422 is greater than 25% of the first area 420. According to equation 13, when the first area 420 is the first area $A_{LOOP1}$ and the second area 422 is the second area $A_{LOOP2}$, the area overlap quotient $A_{QUOTIENT}$ is greater than 0.25 between the resonant current loop 130 and the pickup loop 144. In view of the above example, the pickup current loop 300 of the pickup loop 144 is significantly inductively coupled to the resonant current loop 130. Other arrangements and/or configurations of the power-routing 132, the ground-routing 134, and the pickup loop 144 are within the scope of the present disclosure.

Figure 5A:
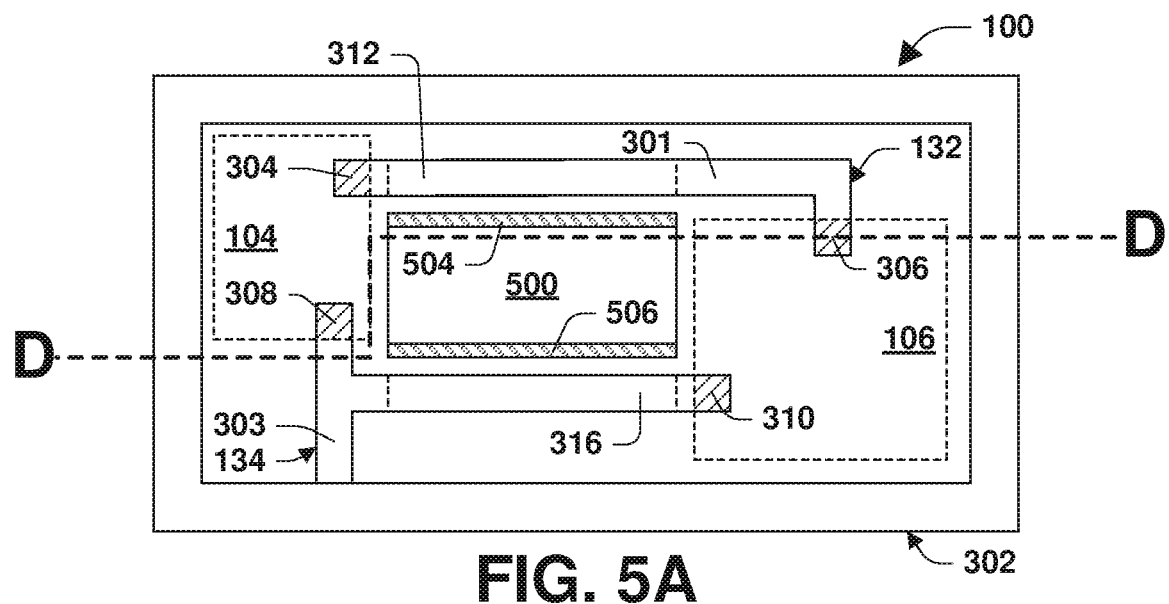
FIG. 5A-5C are top-down views and FIG. 5D is a sectional view of an integrated circuit, according to some examples.
Figure 5B:
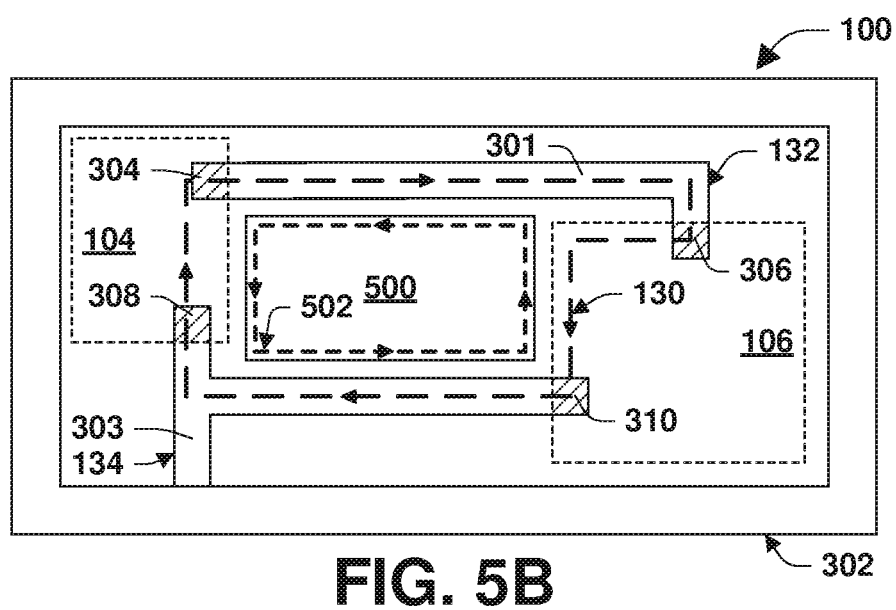
Figure 5C:
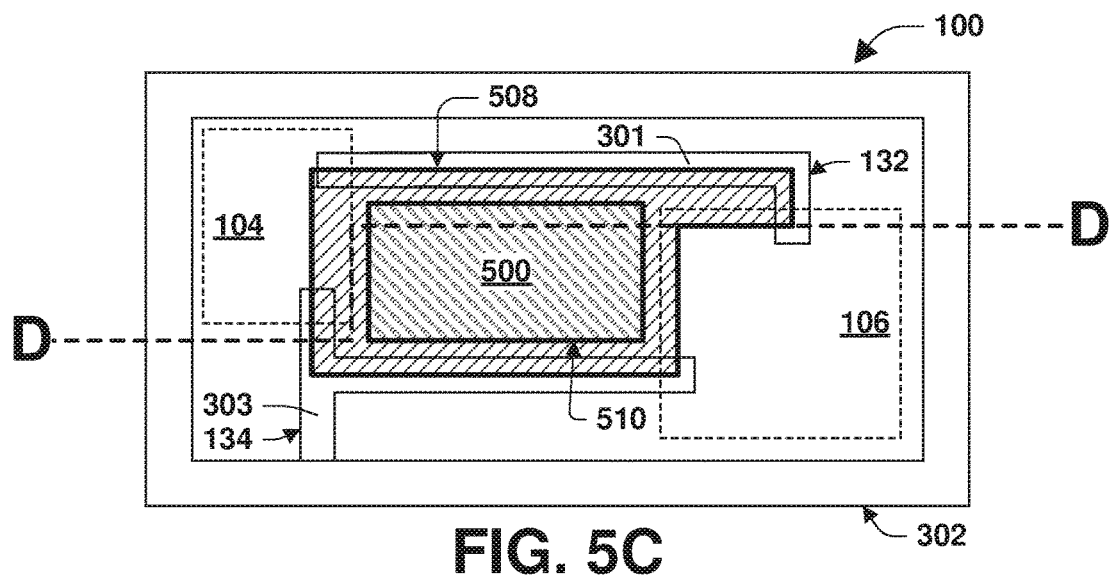
Figure 5D:
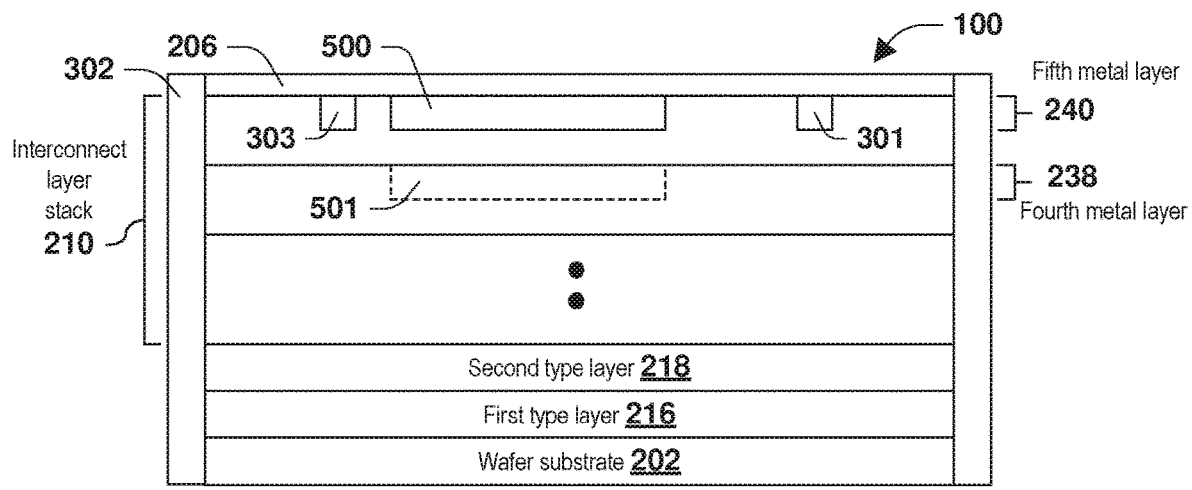

FIGS. 5A-5C are top-down views and FIG. 5D is a sectional view of the IC 100, according to some examples. FIG. 5A illustrates a layout of the IC 100 including the first circuit module 104, the second circuit module 106, the power-routing 132, the ground-routing 134, the seal ring 302, and a pickup loop 500 formed as a continuous metal sheet. FIG. 5B illustrates the IC 100 of FIG. 5A, which includes the resonant current loop 130. A pickup current loop 502 is induced in the pickup loop 500 in response to the resonant current loop 130. FIG. 5C illustrates areas spanned by the resonant current loop 130 and the pickup current loop 502. FIG. 5D is a sectional view of the IC 100 taken along the line D-D of FIGS. 5A and 5C. In this example, the first circuit module 104, the second circuit module 106, the power-routing 132, the ground-routing 134, the seal ring 302, and the resonant current loop 130 are the same as in FIGS. 3A and 3B.

The pickup loop 500 may be configured and/or arranged according to any of the examples set forth above. In the illustrated example, the pickup loop 500 is floating (e.g., not connected to ground or a regulated power domain). In another example, the pickup loop 500 is connected to ground (e.g., by connection to the ground segment 303 and/or the seal ring 302) or connected to a regulated power domain (e.g., the power segment 301 supplying VINT). In the illustrated example, the pickup loop 500 is provided in the same metal layer as the power segment 301 and the ground segment 303 (e.g., a metal layer in the interconnect layer stack 210). The pickup loop 500 may span multiple interconnect layers by way of a plurality of sections and may contain a plurality of vias for electrical connection there between. The pickup loop 500 may comprise a plurality of separate continuous metal sheets (e.g., metal sheets that are not electrically connected). The pickup loop 500 may comprise a plurality of separate continuous metal sheets where one or more separate metal sheets are electrically connected to at least one of ground, a regulated power domain, another metal sheet, or a loop-shaped pickup loop (e.g., the pickup loop 144).

In the example illustrated in FIG. 5B, the pickup loop 500 may be configured to follow the resonant current loop 130. The power segment 301 includes the induction section 312 and the pickup loop 500 includes an induction section 504 that is horizontally adjacent to and follows the induction section 312. The ground segment 303 includes the induction section 316 and the pickup loop 500 includes an induction section 506 that is horizontally adjacent to and follows the induction section 316. Other arrangements and/or configurations of the pickup loop 500 are within the scope of the present disclosure.

In the example illustrated in FIG. 5B, the pickup current loop 502 can be interpreted as eddy currents in the pickup loop 500. The inductance value Lm4,loop, is a loop inductance that arises from the magnetic field created by the pickup current loop 502. The pickup loop 500 is similar to the pickup loop 144 of FIG. 3A, with an interior filled with metal. A negligible amount of current flows in the filled interior of the pickup loop 500. Current mostly flows in concentrated paths in the pickup loop 500 close to the resonant current loop 130 (e.g., along a perimeter of the pickup loop 500). The pickup loop 500 may be utilized if a distance between the power-routing 132 (VINT) and the ground-routing 134 (GND) is small, very small, and/or shaped in a configuration that may not be closely followed by a loop-shaped pickup loop (e.g., the pickup loop 144 of FIG. 3A).

FIG. 5C illustrates a first area 508 spanned by the resonant current loop 130 and a second area 510 spanned by the pickup loop 500. For example, the intersection between the first area 508 and the second area 510 is greater than 25% of the first area 508. In view of the above example, the pickup loop 500 is inductively coupled to the resonant current loop 130.

FIG. 5D is a sectional view of the IC 100 taken along the line D-D of FIGS. 5A and 5C. FIG. 5D illustrates an example where the pickup loop 500 is formed in the fifth metal layer 240 of the interconnect layer stack 210 of FIG. 2B (e.g., a top-most metal layer). The power segment 301 of the power-routing 132 and the ground segment 303 of the ground-routing 134 are also provided in the fifth metal layer 240. In this example, the pickup loop 500 is provided in the same metal layer as the power-routing 132 and the ground-routing 134. In another example a pickup loop 501 is formed in the fourth metal layer 238 of the interconnect layer stack 210 of FIG. 2B. In this example, the pickup loop 501 is provided in a metal layer different from the power segment 301 of the power-routing 132 and the ground segment 303 of the ground-routing 134. The pickup loop 501 overlaps the power segment 301 and the ground segment 303. Other arrangements and/or configurations of the power-routing 132, the ground-routing 134, the pickup loop 500, and the pickup loop 501 are within the scope of the present disclosure.

Figure 6A:
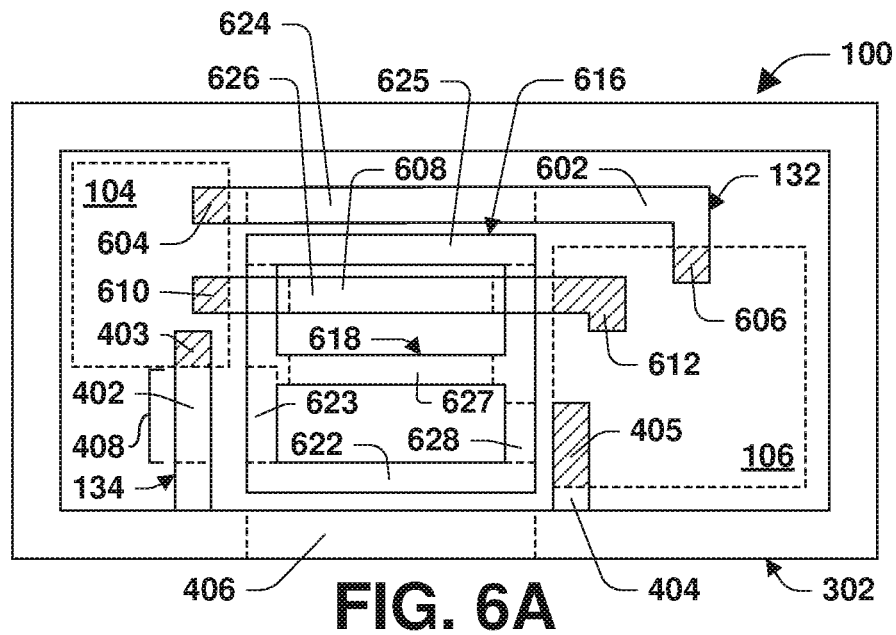
FIGS. 6A-6D are top-down views and FIG. 6E is a physical model of an integrated circuit, according to some examples.
Figure 6B:
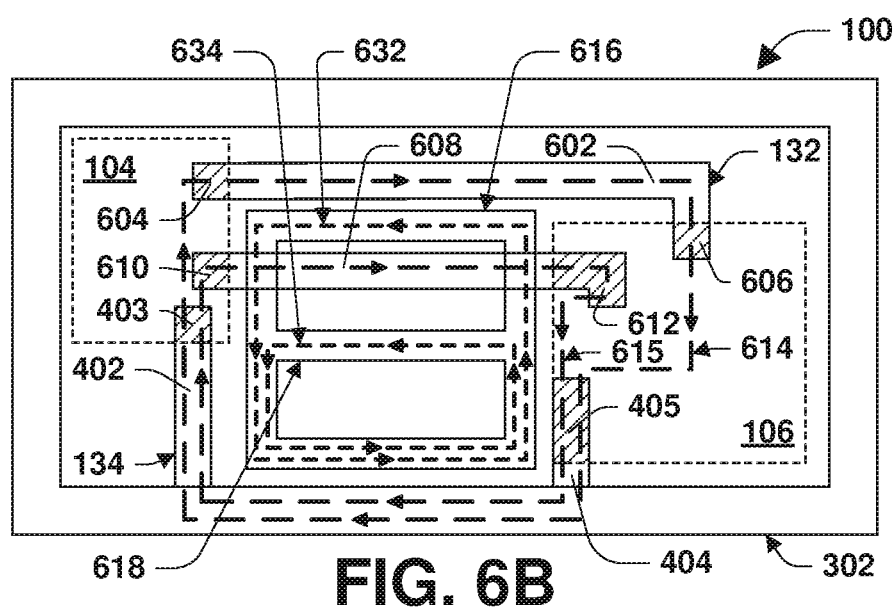
Figure 6C:
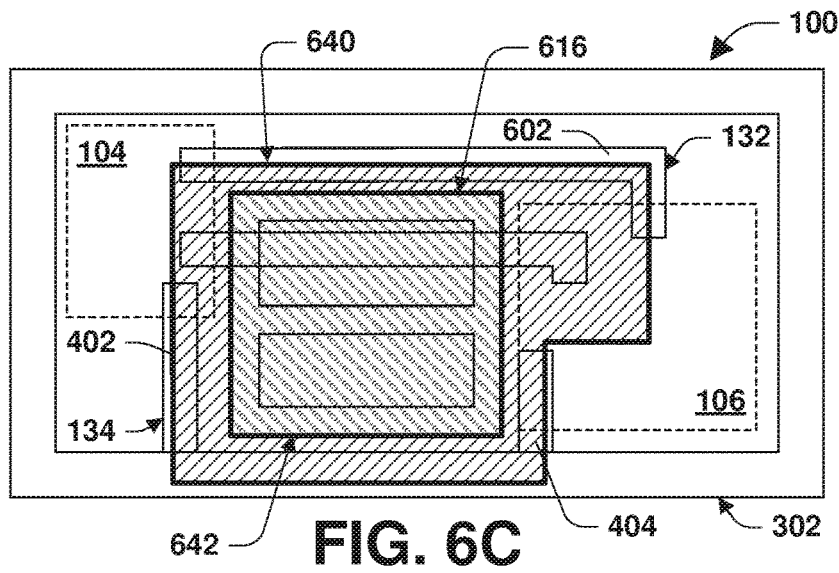
Figure 6D:
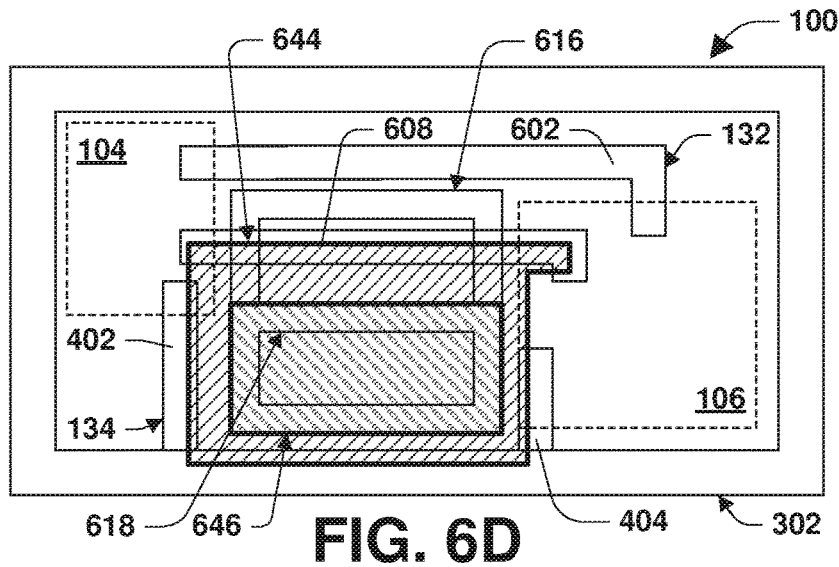
Figure 6E:
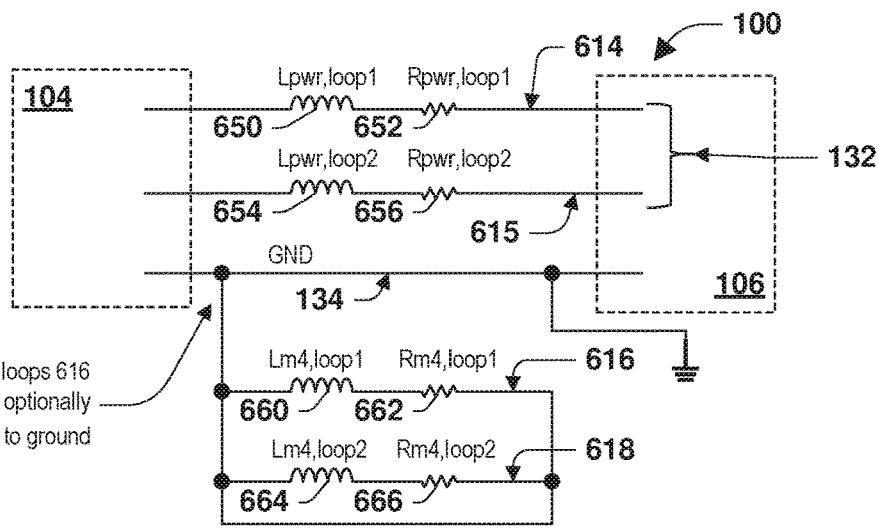

FIGS. 6A-6D are top-down views and FIG. 6E is a physical model of the IC 100, according to some examples. FIG. 6A illustrates a layout of IC 100 including the first circuit module 104, the second circuit module 106, the power-routing 132, the ground-routing 134, and the seal ring 302. In this example, the first ground segment 402, the second ground segment 404, and the seal ring 302 are the same as in FIG. 4A. The seal ring 302 is coupled to ground. FIG. 6B illustrates the IC 100 of FIG. 6A, which includes a first resonant current loop 614 and a second resonant current loop 615. A first pickup current loop 632 is induced in a first pickup loop 616 in response to the first resonant current loop 614. A second pickup current loop 634 is induced in a second pickup loop 618 in response to the second resonant current loop 615. FIG. 6C illustrates areas spanned by the first resonant current loop 614 and the first pickup current loop 632. FIG. 6D illustrates areas spanned by the second resonant current loop 615 and the second pickup current loop 634. FIG. 6E is a physical model of the power-routing 132, the ground-routing 134, the first pickup loop 616, and the second pickup loop 618 that are present in the IC 100 of FIG. 6A. FIG. 6E is a generalization of Lpwr,loop, Rpwr,loop, Lm4,loop, Rm4,loop to a scenario in which multiple power domains (e.g., VINT1, VINT2) are present, which is shown in FIG. 6A. According to this example, resonances in multiple power domains (e.g., VINT1 and VINT2, which are provided by first power segment 602 and second power segment 608) that share a common return conductor (e.g., first ground segment 402, second ground segment 404, and seal ring 302) may be dampened by way of multiple pickup loops. The resonances in multiple power domains may be dampened by multiple connected pickup loops (e.g., the first pickup loop 616 and the second pickup loop 618).

In the example illustrated in FIG. 6B, the first resonant current loop 614 arises in a physical structure defined by the first circuit module 104, the first power segment 602, the second circuit module 106, the second ground segment 404, the seal ring 302, and the first ground segment 402. The current in the first resonant current loop 614 flows from the first circuit module 104 at a first power section 604, along the first power segment 602 from the first power section 604 to a second power section 606, across the second circuit module 106 from the second power section 606 to the second ground section 405, along the second ground segment 404 from the second ground section 405 to the seal ring 302, along the seal ring 302 from the second ground segment 404 to the first ground segment 402, along the first ground segment 402 from the seal ring 302 to the first ground section 403, and then across the first circuit module 104 from the first ground section 403 back to the first power section 604.

In the example illustrated in FIG. 6B, the second resonant current loop 615 arises in by a physical structure defined by the first circuit module 104, the second power segment 608, the second circuit module 106, the second ground segment 404, the seal ring 302, and the first ground segment 402. The current in the second resonant current loop 615 flows from the first circuit module 104 at a third power section 610, along the second power segment 608 from the third power section 610 to a fourth power section 612, across the second circuit module 106 from the fourth power section 612 to the second ground section 405, along the second ground segment 404 from the second ground section 405 to the seal ring 302, along the seal ring 302 from the second ground segment 404 to the first ground segment 402, along the first ground segment 402 from the seal ring 302 to the first ground section 403, and then across the first circuit module 104 from the first ground section 403 back to the third power section 610.

The first pickup loop 616 and the second pickup loop 618 are respectively configured to follow the first resonant current loop 614 and the second resonant current loop 615. The seal ring 302 includes the induction section 406. The first pickup loop 616 and the second pickup loop 618 share an induction section 622 that is horizontally adjacent to and follows the induction section 406. The first ground segment 402 includes the induction section 408 and the first pickup loop 616 and the second pickup loop 618 share an induction section 624 that is horizontally adjacent to and follows the induction section 408. The first power segment 602 includes an induction section 624 and the first pickup loop 616 includes an induction section 625 that is horizontally adjacent to and follows the induction section 624. The second power segment 608 includes an induction section 626 and the second pickup loop 618 includes an induction section 627 that is horizontally adjacent to and follows the induction section 626. The second ground segment 404 includes the second ground section 405 and the first pickup loop 616 and the second pickup loop 618 share an induction section 628 that is horizontally adjacent to and follows the second ground section 405. In view of the above first resonant current loop 614 is significantly inductively coupled to the first pickup current loop 632 and the second resonant current loop 615 is significantly inductively coupled to the second pickup current loop 634. Other inductive couplings among the aforementioned loops may also exist, which may be taken into account during the design and optimization of the pickup loops.

FIG. 6C illustrates a first area 640 spanned by the first resonant current loop 614 and a second area 642 spanned by the first pickup loop 616. According to an example and also with reference to FIG. 6E, the first pickup loop 616 is provided with dimensions to (1) maximize the inductive coupling between a first resonant current loop inductor 650, having an inductance value of Lpwr,loop1, and a first pickup loop inductor 660, having an inductance value of Lm4,loop1 (i.e., between the first resonant current loop 614 and the first pickup loop 616), and (2) to tune the first pickup loop resistor 662, having a series resistance value of Rm4,loop1, through flexible routing and layout. For example, the intersection between the first area 640 and the second area 642 is greater than 25% of the first area 640. According to equation 13, when the first area 640 is the first area $A_{LOOP1}$ and the second area 642 is the second area $A_{LOOP2}$, the area overlap quotient $A_{QUOTIENT}$ is greater than 0.25 between the first resonant current loop 614 and the first pickup loop 616. In view of the above example, the first pickup loop 616 is significantly inductively coupled to the first resonant current loop 614. Other arrangements and/or configurations of the power-routing 132, the ground-routing 134, and the first pickup loop 616 are within the scope of the present disclosure.

FIG. 6D illustrates a third area 644 spanned by the second resonant current loop 615 and a fourth area 646 spanned by the second pickup loop 618. According to an example and also with reference to FIG. 6E, the second pickup loop 618 is provided with dimensions to (1) maximize the inductive coupling between a second resonant current loop inductor 654, having an inductance value of Lpwr,loop2, and a second pickup loop inductor 664, having an inductance value of Lm4,loop2 (i.e., between the second resonant current loop 615 and the second pickup loop 618), and (2) to tune the second pickup loop resistor 666, having a series resistance value of Rm4,loop2, through flexible routing and layout. For example, the intersection between the third area 644 and the fourth area 646 is greater than 25% of the third area 644. According to equation 13, when the third area 644 is the first area $A_{LOOP1}$ and the fourth area 646 is the second area $A_{LOOP2}$, the area overlap quotient $A_{QUOTIENT}$ is greater than 0.25 between the second resonant current loop 615 and the second pickup loop 618. In view of the above example, the second pickup loop 618 is significantly inductively coupled to the second resonant current loop 615. Other arrangements and/or configurations of the power-routing 132, the ground-routing 134, and the second pickup loop 618 are within the scope of the present disclosure.

FIG. 6E is a physical model of the power-routing 132, the ground-routing 134, and the above-referenced loops corresponding to the IC 100 of FIG. 6A. The circuit elements of FIG. 6E represent parasitic elements and not semiconductor devices. As illustrated, the first resonant current loop inductor 650, having the inductance value Lpwr,loop1, corresponds to a loop inductance over the first resonant current loop 614 and the second resonant current loop inductor 654, having the inductance value Lpwr,loop2, corresponds to a loop inductance over the second resonant current loop 615. Note that also Lpwr,loop1 and Lpwr,loop2 are necessarily significantly coupled because they share a common return conductor connected to ground (e.g., the seal ring 302). A first power loop resistor 652, having a parasitic resistance value Rpwr,loop1, is the parasitic resistance of the first resonant current loop 614 and a second power loop resistor 656, having a parasitic resistance value Rpwr,loop2, is the parasitic resistance of the second resonant current loop 615.

According to an example, the first pickup loop 616 is physically and electrically connected to the second pickup loop 618. According to an example, the pickup loops can be optionally connected to ground, e.g., to the seal ring 302, as symbolized in FIG. 6E. According to another example, the pickup loops can be optionally connected to a power supply at a single point (not shown). This connection of the pickup loops to ground or a power supply may be formed, e.g., by a thin metal strip or by a resistor. According to an example, the inductive coupling coefficient K between Lpwr,loop1 and Lm4,loop1 as well as the inductive coupling coefficient K between Lpwr,loop2 and Lm4,loop2 may be maximized. According to an example, the loop inductances (e.g., Lpwr,loop1, Lpwr,loop2, Lm4,loop1, Lm4,loop2), all possible inductive coupling coefficients K (e.g., a number of six ("6") inductive coupling coefficients K in the case of two power domains, i.e., Lpwr,loop1→Lpwr,loop2, Lpwr,loop, 1→Lm4,loop,1, etc.) and resistances (e.g., Rpwr,loop1, Rpwr,loop2, Rm4,loop1, Rm4,loop2) may be subject to multivariate optimization, the aim of which is to simultaneously reduce the Q-factors of all involved resonances (e.g., in the case of two power domains, the resonances of the first resonant current loop 614 and of the second resonant current loop 615).

According to an example, the relevance, the Q-factors and the center frequency of resonances may be determined after fabrication of a silicon prototype, because a pre-silicon prediction of the EMC is complicated: First, the transfer functions from a point of RF-injection to affected circuitry in EMC testing may depend on a large number of parameters. Second, in order to estimate the Q-factor, all RF losses may be predicted, but the underlying semiconductor technology device library may not feature sufficiently accurate models. According to an example, the pickup loops (e.g., the first pickup loop 616 and the second pickup loop 618) may be added after production of a prototype, i.e., in the form of a metal fix. In this case, it may prove especially useful that routing of a pickup loop may be flexible (as described above), and it may span multiple interconnect layers. According to another example, pickup loops may be introduced in the form of a conservative safety measure, e.g., if the presence of a relevant resonance is expected or cannot be ruled out, and if an estimate of the resonance frequency is available. Pickup loops may be provided with comparatively little metal, and may be placed in readily available free space in available interconnect layers. All pickup loops, including those added as a conservative safety measure, may be tested post fabrication using focused ion beam (FIB) cuts. Specifically, if the RF immunity and/or RF emissions do not change after cutting a pickup loop (e.g., at a single point), the cut pickup loop may be considered superfluous and may be removed in a next design step.

According to an example, pickup loops may dampen resonances that span IC-external components. Also in this case, the size of the respective pickup loop may be designed to be similar to the size of a resonant current loop, in order to achieve a high inductive coupling coefficient K. According to an example, the pickup loop may closely follow the resonant current loop in order to achieve a high inductive coupling coefficient K. If a resonant current loop spans bond-wire and/or lead-frame parts, it might be significantly larger than the semiconductor die, and then a pickup loop may be provided that is, partly or completely, off-die. A pickup loop may be provided in IC packages with interposers, IC packages with integrated capacitors, and/or in IC flip-chip packaging solutions. A pickup loop may be provided in multi-die packaging solutions, and/or a pickup loop may be placed on an interposer, a part of an interposer, and/or realized by structuring a semiconductor lead frame. For example, this could include incorporation of bond wires, lead-frame parts or other package-housed metal structures or components, or even IC-external metal structures or IC-external components into the pickup loop.

Figure 7A:
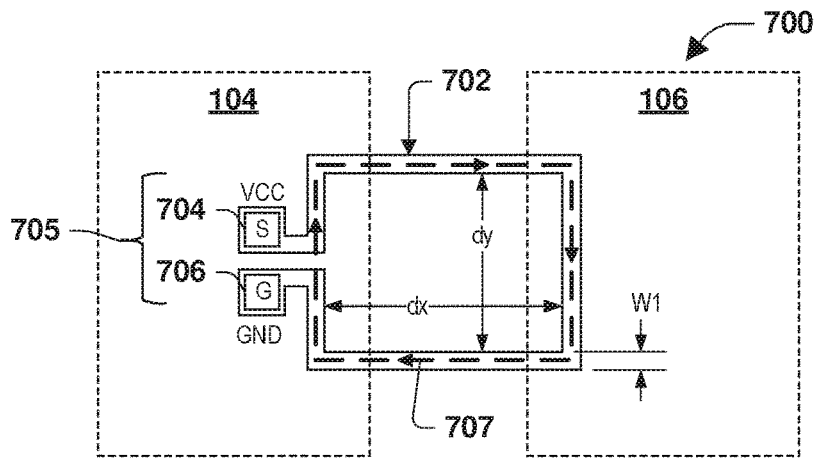
FIG. 7A is a top-down view.
Figure 7B:
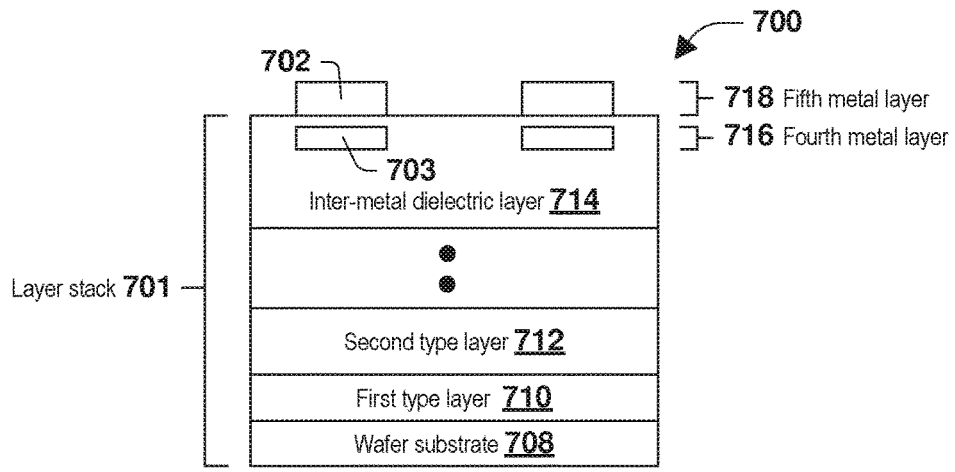
FIGS. 7B-7C are sectional views.
Figure 7C:
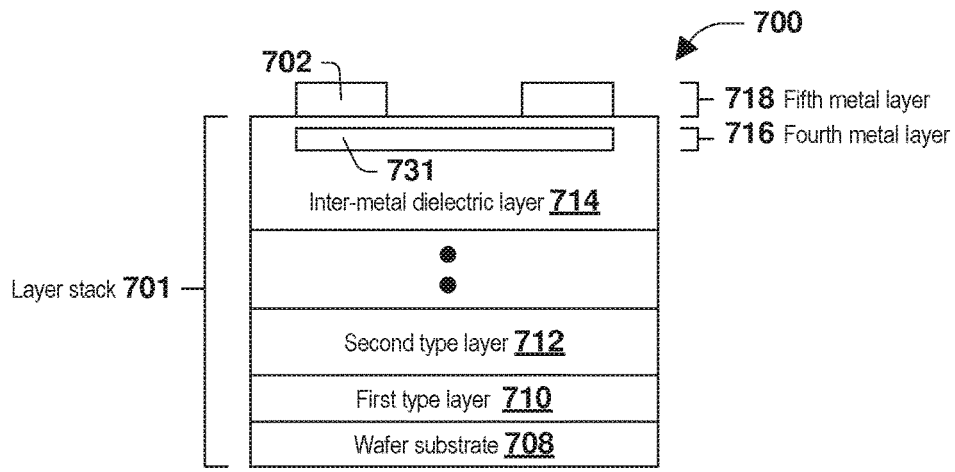
Figure 7D:
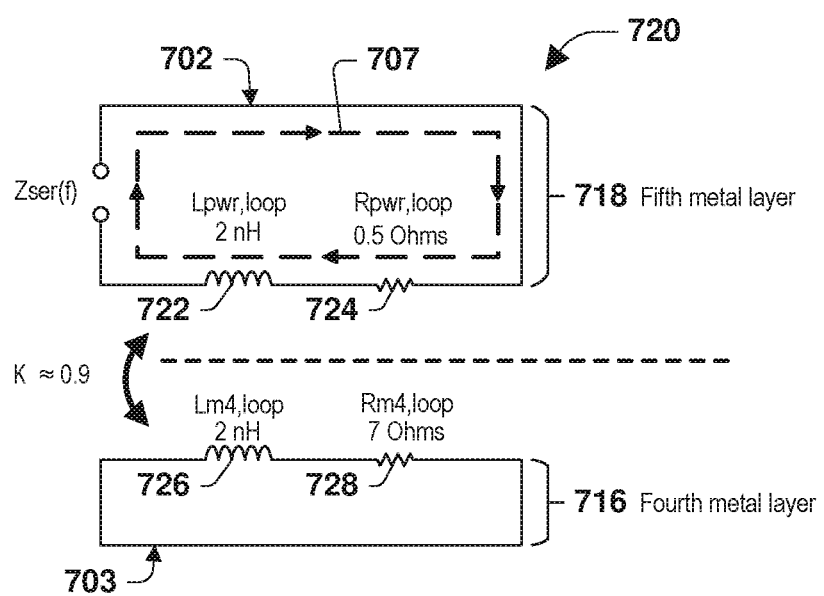
FIG. 7D is a physical model of a test structure, according to some examples.

FIG. 7A is a top-down view, FIGS. 7B-7C are sectional views, and FIG. 7D is a physical model of a test structure 700, according to some examples. The test structure 700 is used to experimentally evaluate aspects of the present disclosure. FIG. 7A illustrates a layout of the test structure 700. The pickup loop 703, which is present in the test structure 700, is not shown in FIG. 7A for clarity. For the purpose of experimental validation, a plurality of passive test-structures (i.e., the test structure 700 and variants of the test structure 700), were fabricated in a BCD technology and characterized using a vector network analyzer. The test loop 702 emulates a resonant current loop 707 between the first circuit module 104 being a power source, e.g. a voltage regulator, and the second circuit module 106 being a load. In the test structure 700, a (power,ground)-port 705 of the first circuit module 104 is probed, whereas a (power,ground)-port of the second circuit module 106 (not shown) is shorted-out, because then, according to equation 2, the complex series impedance Zser(f) measured at the (power,ground)-port 705 (i.e., a first port) can be used to compute the series loss tangent. The test loop 702 is placed in a low-ohmic power metal layer, i.e., a power metal layer. This is representative of a typical power-routing structure between the first circuit module 104 and the second circuit module 106. An SG-wafer-prober is attached to an S ("SIGNAL") pad 704 that is connected to the power segment at the first circuit module 104, and a G ("GROUND") pad 706 that is connected to the ground segment at the first circuit module 104. The test loop 702 has a width W1 of 15 um, an inner horizontal diameter along the x-axis dx and an inner vertical diameter along the y-axis dy. The circumference of the test loop 702, is 2dx+2dy=2.41 mm.

FIG. 7B illustrates a sectional view of the test structure 700 of FIG. 7A, including a layer stack 701. The layer stack 701 comprises a number of layers set forth below, beginning with a wafer substrate 708 and a first type layer 710 (i.e., an n-buried layer) adjacent to and vertically on top of the wafer substrate 708. A second type layer 712 (i.e., including two p-doped implants, which will be called logic implant and p-well in the following), are adjacent to and vertically on top of the first type layer 710. An inter-metal dielectric layer 714 is adjacent to and vertically on top of the second type layer 712. A fourth metal layer 716 (i.e., Metal-4 layer including the pickup loop 703) is separated from the fifth metal layer 718 by the inter-metal dielectric layer 714. The pickup loop 703 is a closed metal loop, similar to the pickup loop 144 illustrated by FIG. 2A. The fifth metal layer 718 (e.g., a top power metal layer including the test loop 702) is adjacent to and vertically on top of the inter-metal dielectric layer 714. In other words, the test loop 702 is vertically above the pickup loop 703 and separated by inter-metal dielectric.

FIG. 7C illustrates a sectional view of a variant of the test structure 700—it contains the test loop 702 and a pickup loop 731 formed as a continuous metal sheet (i.e., added in the fourth metal layer 716 (Metal-4 layer) below the test loop 702). According to this example, the pickup loop 731 is a continuous metal rectangle with the same circumference as the pickup loop 703 of FIG. 7B.

FIG. 7D illustrates a physical model 720 of the test loop 702 and the pickup loop 703. The physical model 720 contains only a single resonant current loop, which is called resonant current loop 707. According to an example, the test loop 702 has a power loop inductance, represented by an inductor 722 having an inductance value Lpwr,loop equal to 2 nH, and a power loop series resistance, represented by a resistor 724 having a resistance value Rpwr,loop equal to 0.5 Ohms. The pickup loop 703 has a pickup loop inductance, represented by a pickup loop inductor 726 having an inductance value Lm4,loop equal to 2 nH, and a pickup loop resistance, represented by pickup loop resistor 728 having a series resistance value Rm4,loop equal to 7 Ohms. The parameters of the physical model 720 were obtained, with reference to FIGS. 8A and 8B set forth below, by fitting this model to the measurement data, which will be discussed in the following: The inductance value Lpwr,loop of 2 nH, the inductance value Lm4,loop of 2 nH, and the inductive coupling coefficient Kappa (K)≈0.9 can be observed from the measurement curves 802 and 814 of FIG. 8A (plotting frequency in MHz vs. inductance in nH) and the measurement curves 804 and 816 of FIG. 8B (plotting frequency in MHz vs. series loss tangent). The measurement curves 814 and 816 represent the measurement result of the test structure 700 as described above, whereas the measurement curves 802 and 804 represent the measurement result of a variant of the test structure 700, in which the pickup loop was removed. The parasitic metal resistance values Rpwr, loop and Rm4,loop in FIG. 7D were computed using data provided for the used semiconductor technology by the factory.

Figures 8A, 8B:
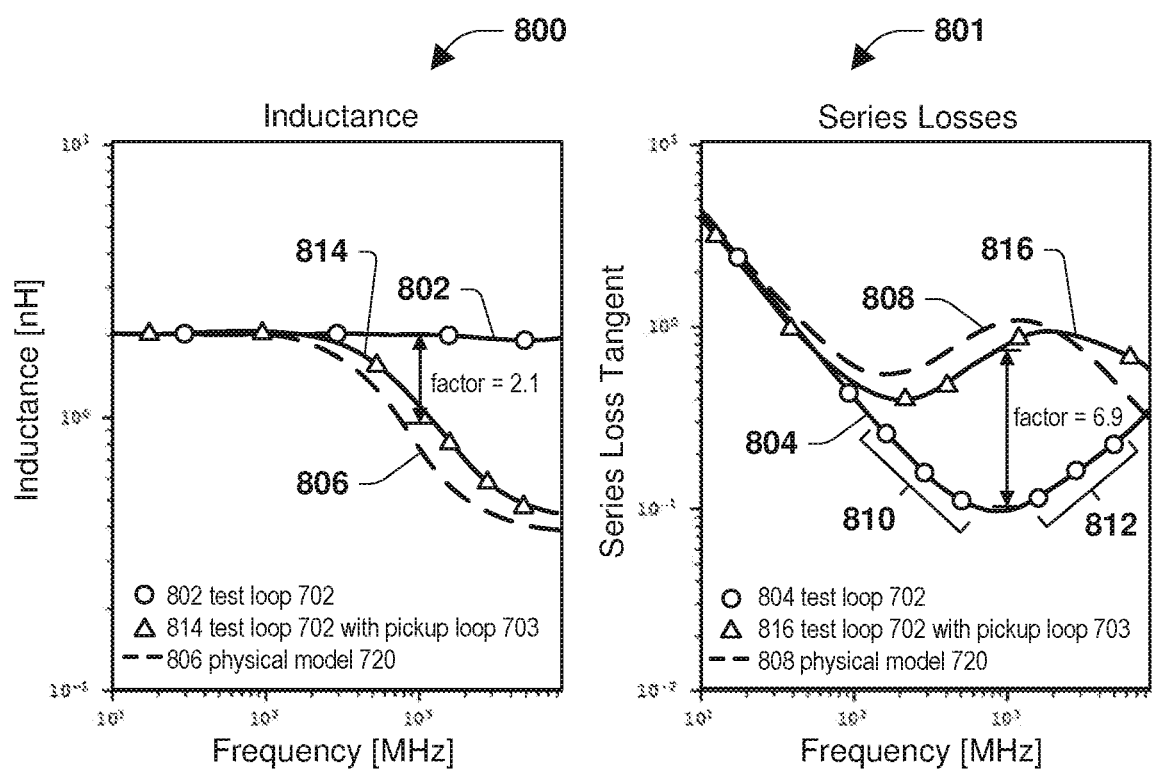
FIGS. 8A and 8B are graphs illustrating measurement data and model predictions of the test structure of FIGS. 7A and 7B, and variants of the test structure 700, according to some examples.

FIGS. 8A and 8B are graphs illustrating measurement data and model predictions of the test structure 700 of FIGS. 7A-7C, and variants of the test structure 700, according to some examples. In addition to measurement data, FIGS. 8A and 8B contain the prediction provided by the fitted physical model 720 of FIG. 7D. FIGS. 8A and 8B plot frequency in MHz vs. the inductance of the discussed test structure and the series loss tangent of the discussed test structure, respectively. Specifically, the inductance L(f) and the series loss tangent tan OW were computed according to equations 2 and 3 from Zser(f), as set forth in the following equation 15:

$$L(f) = Im(Zser(f))/(2 \cdot \pi \cdot f)$$

$$\tan \delta(f) = Re(Zser(f))/Im(Zser(f)) \quad \text{Equation 15}$$

In these equations, Zser(f) is the impedance measured with a vector network analyzer between the S ("SIGNAL") pad 704 and the G ("GROUND") pad 706.

FIG. 8A illustrates a measurement curve 802 (circle reference points) of a variant of the test structure 700, in which the test loop 702 is present but the pickup loop 703 is not present/was removed. Likewise, FIG. 8B illustrates a measurement curve 804 (circle reference points) of a variant of the test structure 700, in which only the test loop 702 itself is present but the pickup loop 703 is not present/was removed. In the measurements 802/804, no metal structures (except filling structures) were present between the fifth metal layer 718 (power metal layer) and the layers below the inter-metal dielectric layer 714 (e.g., 712, 710, and 708). FIG. 8A indicates that the inductance as set forth by measurement curve 802 is roughly constant in frequency up to the highest measured frequency of 8.5 GHz.

In FIG. 8B, series losses 810 indicated by the measurement curve 804 are due to the DC-resistance of the test loop 702 (below 1 GHz) and series losses 812 indicated by the measurement curve 804 are due to eddy current losses in the first type layer 710. Increased losses due to the skin-effect are negligible in comparison. The Q-factor of the resonance is necessarily smaller than the reciprocal of the series loss tangent, plotted in FIG. 8B. For example, FIG. 8B shows that even at 4 GHz, series losses 812 (due to eddy current losses) in the first type layer 710 are not enough to reduce the Q-factor below 5.0 (i.e., it would be desirable if series losses 812 due to eddy currents could reduce the Q-factor significantly, but measurement curve 804 indicates that they cannot).

FIGS. 8A and 8B illustrate the measurement curve 814 and the measurement curve 816 (up-triangle reference points) of the test loop 702 with the addition of the pickup loop 703 in fourth metal layer 716 (Metal-4 layer) below the test loop 702. In FIG. 8A, at a frequency of interest, e.g., the (suspected) resonance frequency of 1 GHz, a change in inductance by a factor=2.1 is caused by adding the pickup loop 703. Moreover, here, the Q-factor is strongly reduced from 100 MHz to at least 8.5 GHz, as can be seen by comparing the measurement curves 816 and 804 in FIG. 8B in the range 100 MHz-8.5 GHz. In FIG. 8B, at a frequency of interest of 1 GHz, an increase in the series loss tangent by a factor=6.9 is caused by adding the pickup loop 703. The series loss tangent tan δ(f) of the measurement curve 816 is roughly 0.9 at 2 GHz. Thus, since the Q-factor is bounded by the reciprocal of the series loss tangent, the Q-factor (Q) is bounded by approximately Q<1.1. Even at 300 MHz, the series loss tangent is 0.4, and hence here the Q-factor is bounded by Q<2.5. This shows that, according to an example, the series resistance value Rm4,loop does not have to be tuned to the resonance frequency very precisely.

The dashed curve 806 in FIG. 8A and the dashed curve 808 in FIG. 8B were computed from the impedance Zser(f) that is predicted by the physical model 720 in FIG. 7C. The good coincidence between the dashed curves 806 and 808 in FIGS. 8A/B (representing the model) and the measurement curves 814 and 816 in FIGS. 8A/B (representing measurement data of the test structure 700) provides that the physical model 720 (FIG. 7C) may describe the inductance and the series loss tangent of the test structure 700 (FIGS. 7A and 7B) with a good accuracy.

Pickup loops may provide a safe upper bound on the Q-factor as follows: (1): The Q-factor is always less than 1 divided by the series loss tangent. (2): The series loss tangent approximately equals $K^2/(2 \sqrt{1-K^2})$ if the series resistance value Rm4,loop is tuned to match "$j \cdot 2 \cdot \pi \cdot f_R \cdot Lm4, loop \cdot \sqrt{1-K^2}$," where Lm4,loop is the inductance value of the pickup loop, Rm4,loop is the pickup loop resistance value (also called the series resistance value Rm4,loop above) and K is the inductive coupling coefficient between the pickup loop and the resonant current loop. This can be derived by solving the circuit from FIG. 7D. (3): Therefore, at (2), if Rm4,loop is tuned to match "$j \cdot 2 \cdot \pi \cdot f_R \cdot Lm4, loop \cdot \sqrt{1-K^2}$" at the resonance frequency $f_R$, and if the inductive coupling coefficient K is >=0.9, then the series loss tangent is greater than approximately 0.93. (4): Therefore, with (1) and (2), the Q-factor is also bounded from above by approximately $2 \cdot \sqrt{1-K^2}/K^2$, if Rm4,loop is ideally tuned, i.e., tuned to match "$j \cdot 2 \cdot \pi \cdot f_R \cdot Lm4, loop \cdot \sqrt{1-K^2}$." (5): In conclusion: With a Kappa (K)>=0.9, and with an "ideally tuned R", one can always approximately provide Q<=1. However, if Kappa (K) is significantly less than 1, e.g., 0.75, and if R is imperfectly tuned, e.g., the mismatch being 40% too large, then it may or may not be provided that Q<=1, but it may be provided that Q<=2.5. Moreover, as set forth above, with an inductive coupling coefficient approaching K=1 and an optimally tuned value Rm4,loop=Rpwr,loop, Q-factor may be reduced (e.g., Q-factor may be reduced to Q<1). In an example, the series resistance value Rm4,loop does not have to be tuned to the resonance frequency very precisely.

Figure 9A:
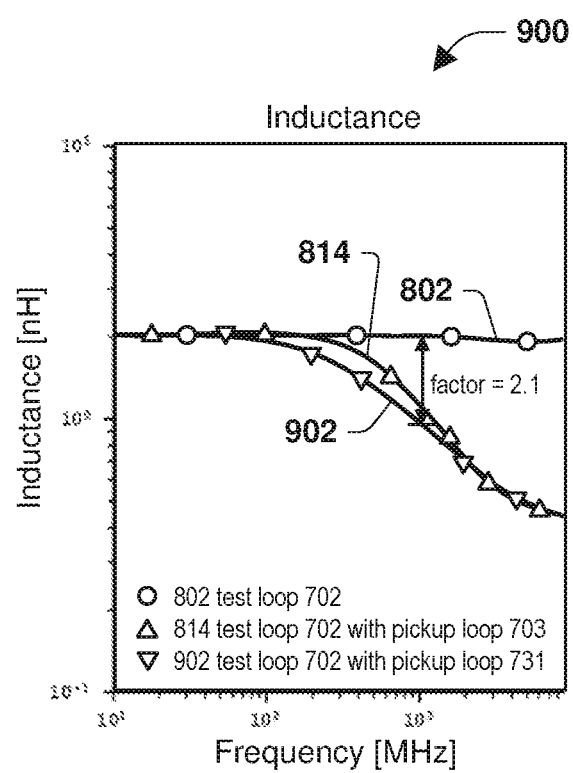
FIGS. 9A and 9B are graphs illustrating measurement data of the test structure of FIGS. 7A, 7B, and 7C, according to some examples.
Figure 9B:
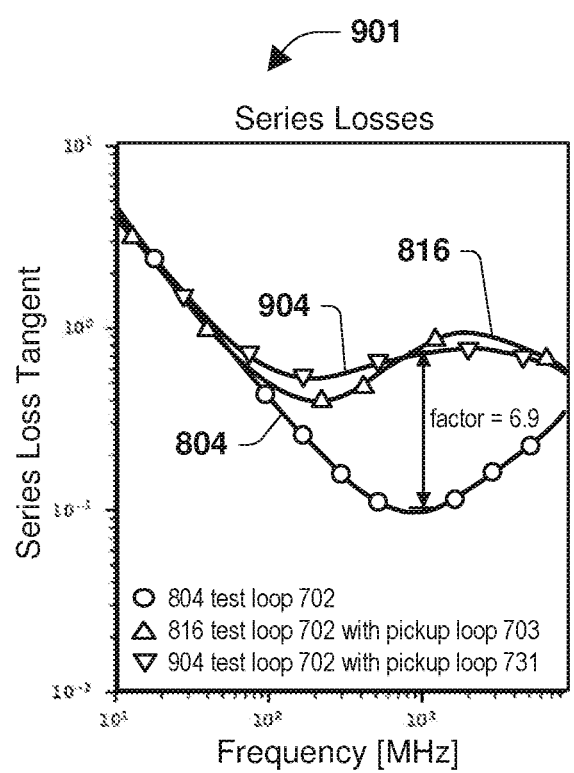

FIGS. 9A and 9B are graphs illustrating measurement data of the test structure of FIGS. 7A, 7B, and 7C, according to some examples. FIG. 9A is a graph 900 plotting frequency in MHz vs inductance in nH and FIG. 9B is a graph 901 plotting frequency in MHz vs. series loss tangent (a dimensionless value). FIGS. 9A and 9B illustrate a measurement curve 902 and a measurement curve 904 (down-triangle reference points), respectively, of the test loop 702 with the addition of the pickup loop 731, as illustrated in FIG. 7C.

The measurement curves 902 and 904, which represent the test loop 702 with the pickup loop 731, are similar to the measurement curves 814 and 816, which represent the test loop 702 with the pickup loop 703. The measurement curves 814 and 816 in FIGS. 9A and 9B are the same as in FIGS. 8A and 8B. This shows that the pickup loop 731 (formed as a continuous metal sheet) acts in a very similar way as the pickup loop formed from a closed continuous ring (e.g., the pickup loop 703), and in fact, the pickup loops 703 and 731 can be considered (mostly) electrically equivalent/interchangeable. Hence, a continuous metal sheet, too, is effective to reduce the Q-factor of a resonance formed over a loop-structure with a shape similar to test loop 702.

Figure 10A:
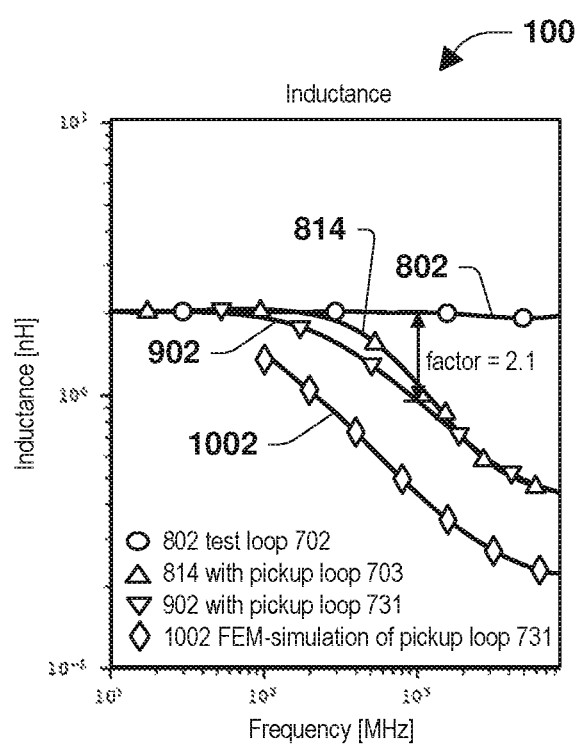
FIGS. 10A and 10B are graphs illustrating measurement data and simulation results of the test structure of FIGS. 7A, 7B, and 7C, according to some examples.
Figure 10B:
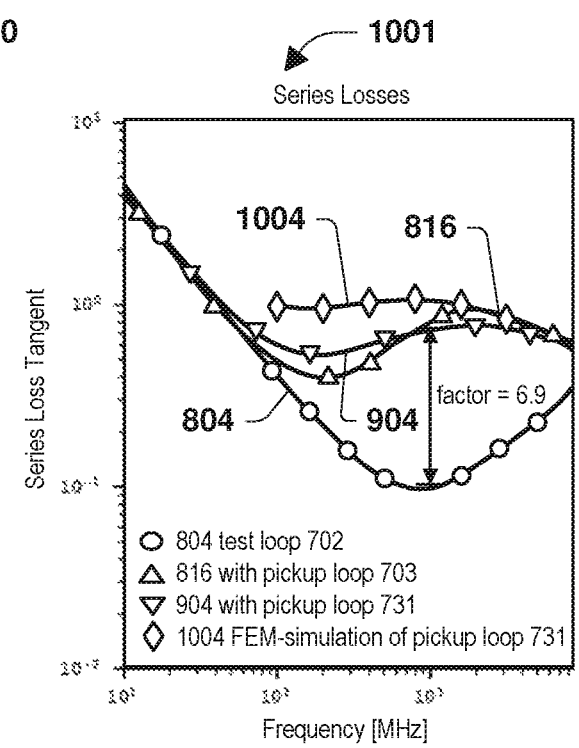

FIGS. 10A and 10B are graphs illustrating measurement data and simulation results of the test structure 700 of FIG. 7A, according to some examples. FIG. 10A is a graph 1000 plotting frequency in MHz vs inductance in nH and FIG. 10B is a graph 1001 plotting frequency in MHz vs. series loss tangent (a dimensionless value). FIGS. 10A and 10B illustrate a simulation curve 1002 and a simulation curve 1004 (diamond reference points), respectively, of the test loop 702 obtained using the electro-magnetic field simulation (Finite Element Method) from a 3D-model that includes the pickup loop 713, the inter-metal dielectric layers and multiple substrate layers, i.e. the wafer substrate, the first type layer 710 and the second type layer 712. As illustrated, a deviation of the simulation curve 1002 from the measurement curves 814 and 902 is mainly due to a neglect of cheesing structures in the metallization. Likewise, a deviation of the simulation curve 1004 from the measurement curves 816 and 904 is also mainly due to a neglect of cheesing structures in the metallization. As set forth in the above example, agreement of the simulation curves 1002 and 1004 with the measurement curves 902 and 904 provides that the observed ability of eddy currents in a continuous metal sheet to dampen the resonance of a resonant current loop can be predicted using electro-magnetic field simulation.

Figure 11A:
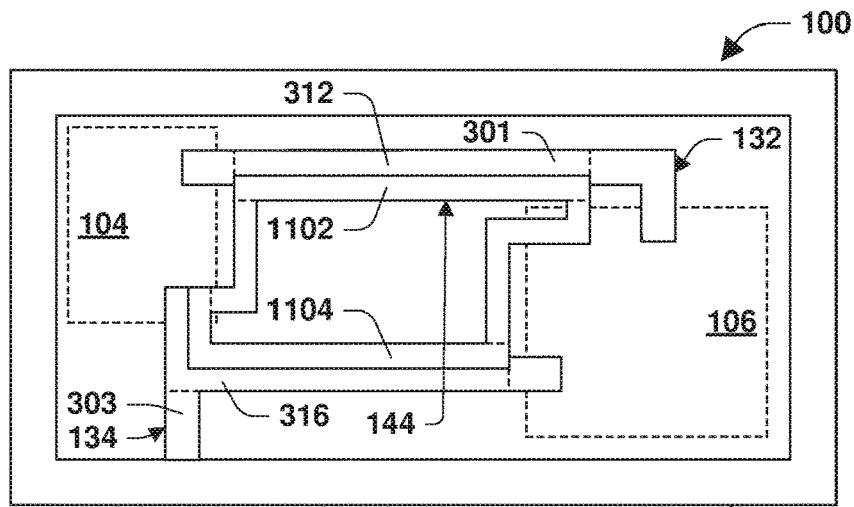
FIGS. 11A-11C are bottom-up views of an integrated circuit, according to some examples.
Figure 11B:
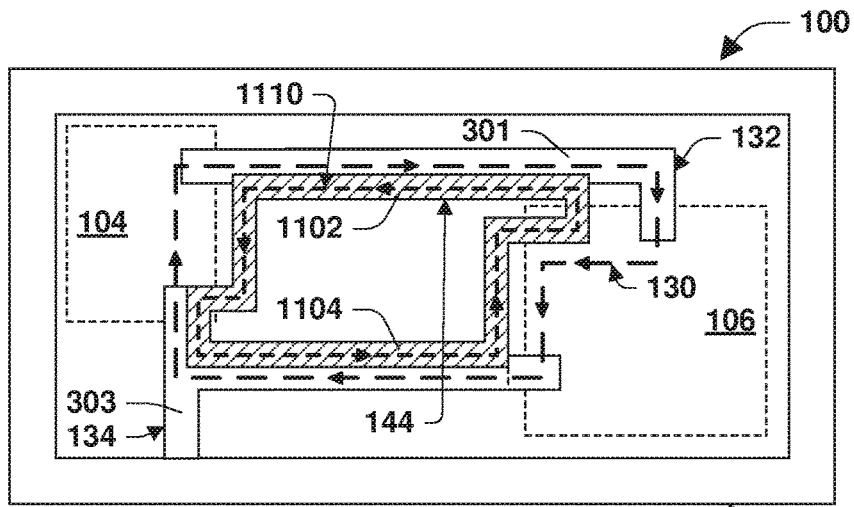
Figure 11C:
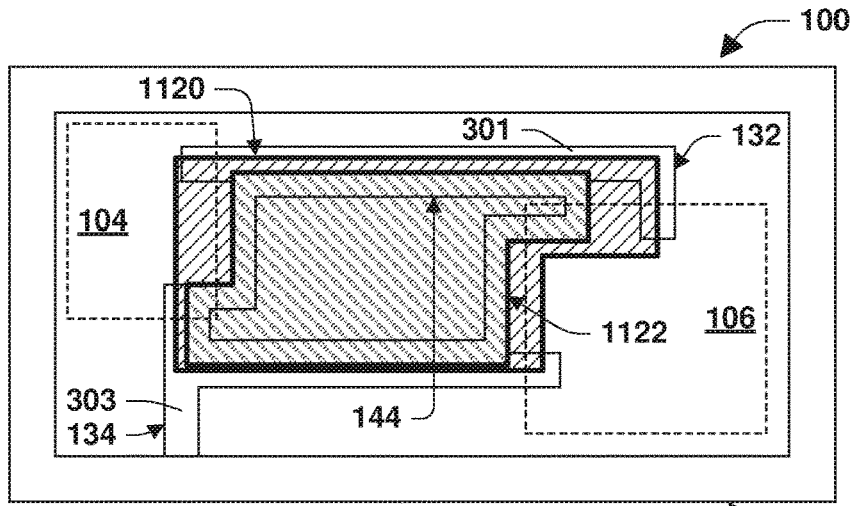

FIGS. 11A-11C are bottom-up views of the IC 100, according to some examples. FIG. 11A is similar to FIG. 3A and illustrates an example in which the resonant current loop 130 is formed between the first circuit module 104 and the second circuit module 106 along the power segment 301 and the ground segment 303. The power segment 301 and/or the ground segment 303 are formed in a metal interconnect layer (e.g., the fifth metal layer 240 of FIG. 2B).

The pickup loop 144 is formed as a loop that is not coupled to ground. The pickup loop 144 closely follows the power segment 301 and the ground segment 303. In a vertical direction, the pickup loop 144 partially overlaps a portion of the power segment 301 and a portion of the ground segment 303. In another example, the pickup loop 144 completely overlaps the portion of the power segment 301 and/or the portion of the ground segment 303. A pickup current loop 1110 is induced in the pickup loop 144 in response to the resonant current loop 130. In the illustrated example, the resonant current loop 130 has a non-rectangular shape and the pickup loop 144 has a different shape, such as the illustrated non-rectangular shape.

In the example illustrated in FIGS. 11A-11O, the pickup loop 144 is formed in an interconnect layer of the interconnect layer stack 210 different from the power segment 301 and the ground segment 303. In an example, the power segment 301 and the ground segment 303 are formed in the fifth metal layer 240 of the interconnect layer stack 210 and the pickup loop 144 is formed in the fourth metal layer 238 of the interconnect layer stack 210. According to an example, the pickup loop 144 may be configured to follow the resonant current loop 130 as illustrated in FIG. 11A. The power segment 301 includes the induction section 312 and the pickup loop 144 includes an induction section 1102 that is vertically adjacent to the induction section 312 and overlaps the power segment 301 by a threshold amount to dampen resonance of the resonant current loop 130. The ground segment 303 includes the induction section 316 and the pickup loop 144 includes an induction section 1104 that is vertically adjacent to the induction section 316 and overlaps the ground segment 303 by a threshold amount to dampen resonance of the resonant current loop 130. Other arrangements and/or configurations of the power segment 301, the ground segment 303, and the pickup loop 144 are within the scope of the present disclosure.

FIG. 11C illustrates a first area 1120 spanned by the resonant current loop 130 and a second area 1122 spanned by the pickup loop 144. According to an example, the pickup loop 144 is provided with dimensions to (1) maximize the inductive coupling coefficient K, and (2) to tune the series resistance value Rm4,loop of the pickup loop resistor 148, as described above, through flexible routing and layout. For example, the intersection between the first area 1120 and the second area 1122 is greater than 25% of the first area 1120. According to equation 13, when the first area 1120 is the first area $A_{LOOP1}$ and the second area 1122 is the second area $A_{LOOP2}$, the area overlap quotient $A_{QUOTIENT}$ is greater than 0.25 between the resonant current loop 130 and the pickup loop 144. In view of the above example, the pickup current loop 1110 of the pickup loop 144 is inductively coupled to the resonant current loop 130.

Figure 12A:
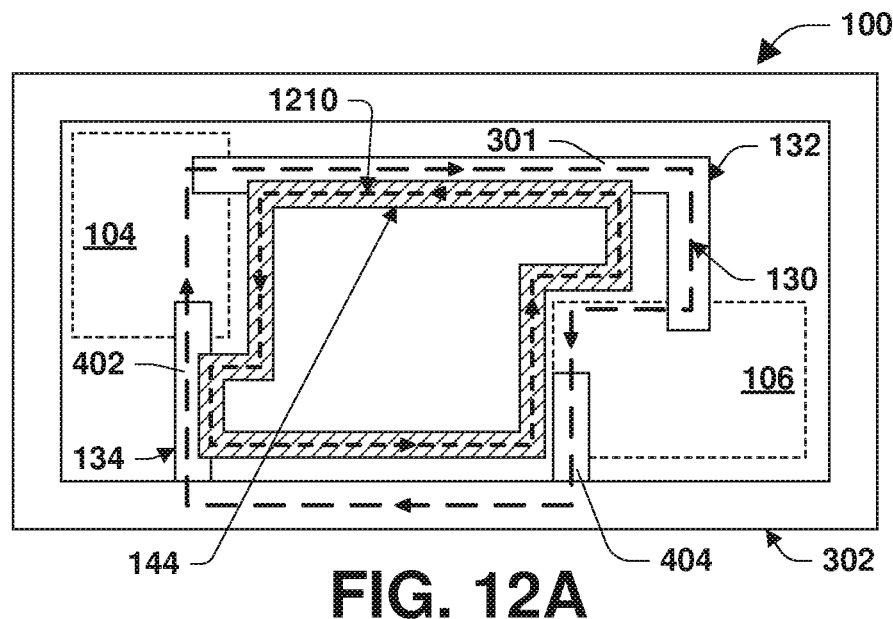
FIGS. 12A and 12B are bottom-up views of an integrated circuit, according to some examples.
Figure 12B:
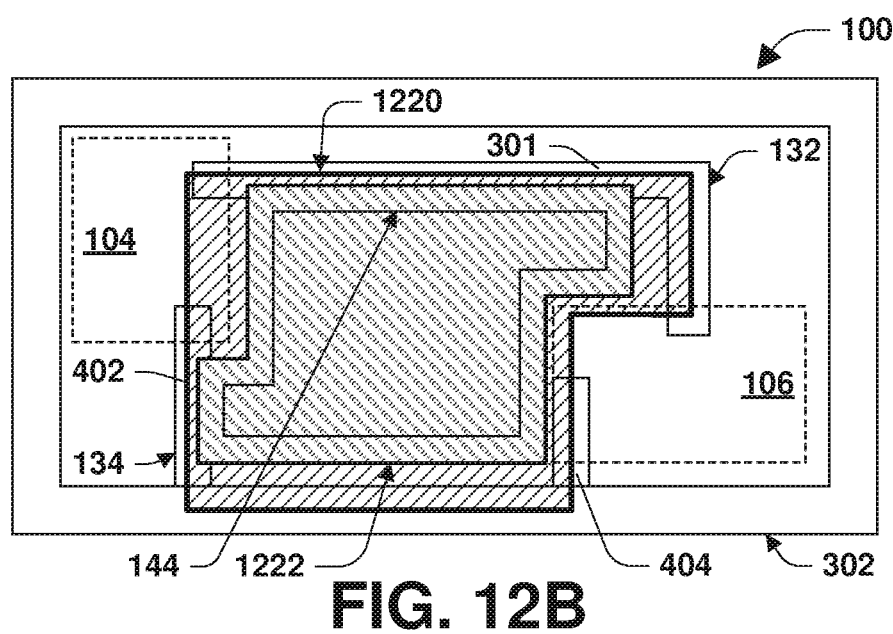

FIGS. 12A and 12B are bottom-up views of the IC 100, according to some examples. FIG. 12A is similar to FIG. 4A and illustrates an example in which the resonant current loop 130 is formed between the first circuit module 104 and the second circuit module 106 along the power segment 301, the second ground segment 404, the seal ring 302, and the first ground segment 402. The power segment 301, the first ground segment 402, and/or the second ground segment 404 are formed in a metal interconnect layer (e.g., the fifth metal layer 240 of FIG. 2B). The first ground segment 402 and the second ground segment 404 are electrically coupled to the seal ring 302.

The pickup loop 144 is formed as a loop that closely follows the power segment 301, the second ground segment 404, the seal ring 302, and the first ground segment 402. In a vertical direction, the pickup loop 144 partially overlaps a portion of the power segment 301 and a portion of the first ground segment 402. In another example, the pickup loop 144 completely overlaps the portion of the power segment 301 and/or the portion of the first ground segment 402. A pickup current loop 1210 is induced in the pickup loop 144 in response to the resonant current loop 130. In the illustrated example, the resonant current loop 130 has a non-rectangular shape and the pickup loop 144 has a different shape, such as the illustrated non-rectangular shape.

In the example illustrated in FIGS. 12A and 12B, the pickup loop 144 is formed in an interconnect layer of the interconnect layer stack 210 different from the interconnect layer of the power segment 301, the first ground segment 402, and the second ground segment 404. In an example, the power segment 301, the first ground segment 402, and the second ground segment 404 are formed in the fifth metal layer 240 of the interconnect layer stack 210 and the pickup loop 144 is formed in the fourth metal layer 238 of the interconnect layer stack 210. According to an example, the pickup loop 144 may be configured to follow the resonant current loop 130 as illustrated in FIG. 12A. The power-routing 132 includes an induction section and the pickup loop 144 includes an induction section that is vertically adjacent to the induction section of the power-routing 132 and overlaps the power-routing 132 by a threshold amount to dampen resonance of the resonant current loop 130. The ground-routing 134 includes an induction section and the pickup loop 144 includes an induction section that is vertically adjacent to the induction section of the ground-routing 134 and overlaps the ground-routing 134 by a threshold amount to dampen resonance of the resonant current loop 130. Other arrangements and/or configurations of the power segment 301, the first ground segment 402, the second ground segment 404, and the pickup loop 144 are within the scope of the present disclosure.

FIG. 12B illustrates a first area 1220 spanned by the resonant current loop 130 and a second area 1222 spanned by the pickup loop 144. According to an example, the pickup loop 144 is provided with dimensions to (1) maximize the inductive coupling coefficient K, and (2) to tune the series resistance value Rm4,loop of the pickup loop resistor 148, as described above, through flexible routing and layout. For example, the intersection between the first area 1220 and the second area 1222 is greater than 25% of the first area 1220. According to equation 13, when the first area 1220 is the first area $A_{LOOP1}$ and the second area 1222 is the second area $A_{LOOP2}$, the area overlap quotient $A_{QUOTIENT}$ is greater than 0.25 between the resonant current loop 130 and the pickup loop 144. In view of the above example, the pickup current loop 1210 of the pickup loop 144 is significantly inductively coupled to the resonant current loop 130.

Figure 13A:
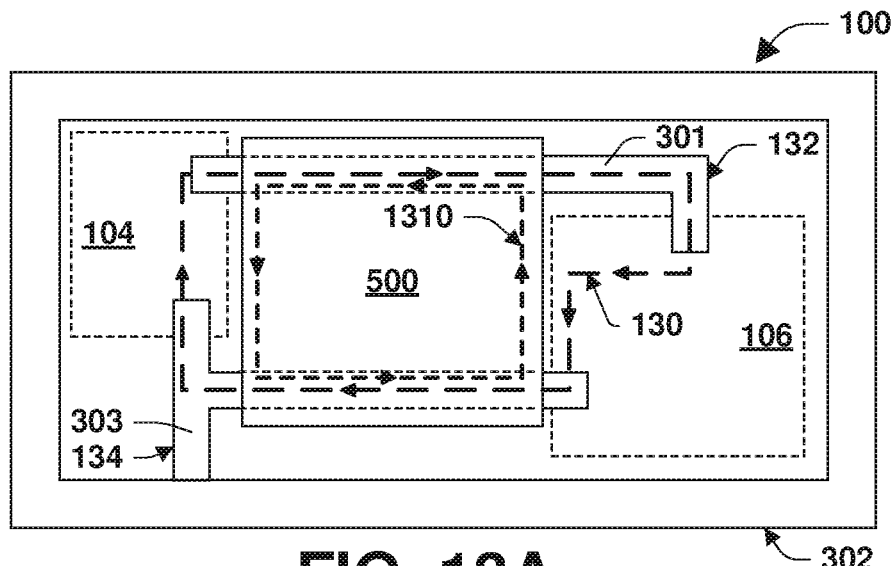
FIGS. 13A and 13B are bottom-up views of an integrated circuit, according to some embodiments.
Figure 13B:
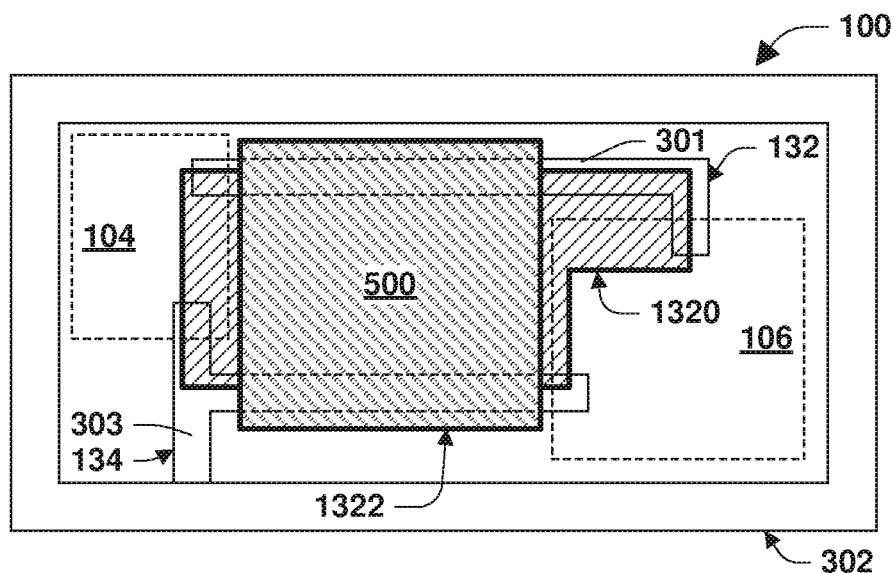

FIGS. 13A and 13B are bottom-up views of the IC 100, according to some examples. FIG. 13A is similar to FIG. 5A and illustrates an example in which the resonant current loop 130 is formed between the first circuit module 104 and the second circuit module 106 along the power segment 301 and the ground segment 303. The power segment 301 and/or the ground segment 303 are formed in a metal interconnect layer (e.g., the fifth metal layer 240 of FIG. 2B).

In the example illustrated in FIG. 13A, the pickup loop 500 is formed as a continuous metal sheet and is not coupled to ground. According to an example, the pickup loop 500 closely follows the power segment 301 and the ground segment 303 and in a vertical direction, the pickup loop 500 completely overlaps a portion of the power segment 301 and a portion of the ground segment 303. In another example, the pickup loop 500 partially overlaps the portion the power segment 301 and/or the portion of the ground segment 303. A pickup current loop 1310 is induced in the pickup loop 500 in response to the resonant current loop 130.

In the example illustrated in FIGS. 13A and 13B, the pickup loop 500 is formed in an interconnect layer of the interconnect layer stack 210 different from the power segment 301 and the ground segment 303. In an example, the power segment 301 and the ground segment 303 are formed in the fifth metal layer 240 of the interconnect layer stack 210 and the pickup loop 500 is formed in the fourth metal layer 238 of the interconnect layer stack 210. According to an example, the pickup loop 500 may be configured to follow the resonant current loop 130 as illustrated in FIG. 13A. The power-routing 132 includes an induction section and the pickup loop 500 includes an induction section that is vertically adjacent to the induction section of the power-routing 132 and overlaps the power-routing 132 by a threshold amount to dampen resonance of the resonant current loop 130. The ground-routing 134 includes an induction section and the pickup loop 500 includes an induction section that is vertically adjacent to the induction section of the ground-routing 134 and overlaps the ground-routing 134 by a threshold amount to dampen resonance of the resonant current loop 130. Other arrangements and/or configurations of the power segment 301, the ground segment 303, and the pickup loop 500 are within the scope of the present disclosure.

FIG. 13B illustrates a first area 1320 spanned by the resonant current loop 130 and a second area 1322 spanned by the pickup loop 500. For example, the intersection between the first area 1320 and the second area 1322 is greater than 25% of the first area 1320. In view of the above example, the pickup current loop 1310 of the pickup loop 500 is inductively coupled to the resonant current loop 130.

Figure 14A:
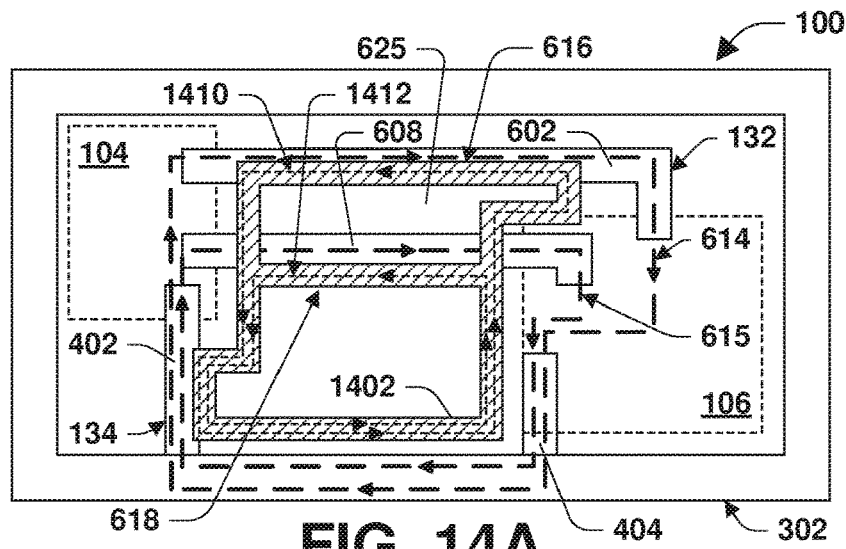
FIGS. 14A-14C are bottom-up views of an integrated circuit, according to some embodiments.
Figure 14B:
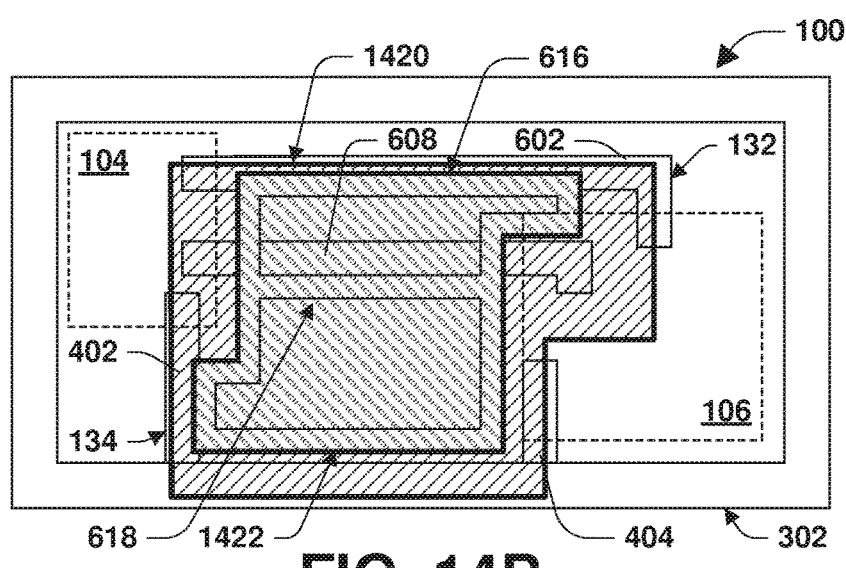
Figure 14C:
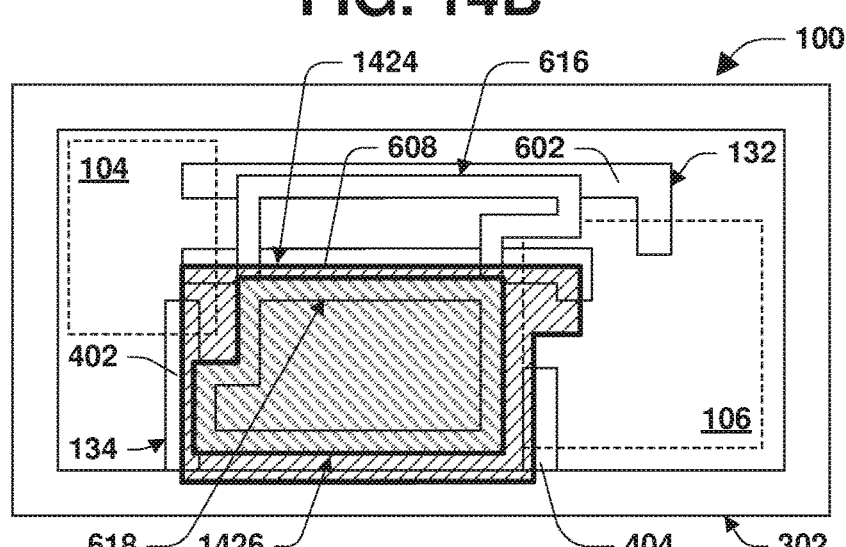

FIGS. 14A-14C are bottom-up views of the IC 100, according to some examples. FIG. 14A is similar to FIG. 6A and illustrates an example in which the first resonant current loop 614 is formed between the first circuit module 104 and the second circuit module 106 along the first power segment 602, the second ground segment 404, the seal ring 302, and the first ground segment 402. The second resonant current loop 615 is formed between the first circuit module 104 and the second circuit module 106 along the second power segment 608, the second ground segment 404, the seal ring 302, and the first ground segment 402. The first power segment 602, the second power segment 608, the second ground segment 404, and/or the first ground segment 402 are formed in a metal interconnect layer (e.g., the fifth metal layer 240 of FIG. 2B).

In the example illustrated in FIG. 14A, the first pickup loop 616 and the second pickup loop 618 are floating (i.e., not connected to power or ground). The first pickup loop 616 and the second pickup loop 618 share at least one section, such as an induction section 1402. The first pickup loop 616 closely follows the first power segment 602, the second ground segment 404, the seal ring 302, and the first ground segment 402. The second pickup loop 618 closely follows the second power segment 608, the second ground segment 404, the seal ring 302, and the first ground segment 402. The first pickup loop 616 vertically overlaps a portion of the first power segment 602 and a portion of the second ground segment 404. In another example, the first pickup loop 616 completely overlaps the portion of the first power segment 602 and/or the portion of the second ground segment 404. The second pickup loop 618 vertically overlaps a portion of the second power segment 608 and the portion of the second ground segment 404. In another example, the second pickup loop 618 completely overlaps the portion of the second power segment 608 and/or the portion of the second ground segment 404. A first pickup current loop 1410 is induced in the first pickup loop 616 in response to the first resonant current loop 614. A second pickup current loop 1412 is induced in the second pickup loop 618 in response to the second resonant current loop 615.

In the example illustrated in FIGS. 14A-14C, the first pickup loop 616 and the second pickup loop 618 are formed in an interconnect layer of the interconnect layer stack 210 different from the interconnect layer of the first power segment 602, the second power segment 608, the second ground segment 404, and the first ground segment 402. In an example, the first power segment 602, the second power segment 608, the second ground segment 404, and the first ground segment 402 are formed in the fifth metal layer 240 of the interconnect layer stack 210 and the first pickup loop 616 and the second pickup loop 618 are formed in the fourth metal layer 238 of the interconnect layer stack 210. According to an example, the first pickup loop 616 and the second pickup loop 618 may be configured to follow the first resonant current loop 614 and the second resonant current loop 615, respectively. The first power segment 602 includes a first induction section and the first pickup loop 616 includes a first induction section that is vertically adjacent to the first induction section of the first power segment 602 and overlaps the first power segment 602 by a threshold amount to dampen resonance of the first resonant current loop 614. The second power segment 608 includes a second induction section and the second pickup loop 618 includes a second induction section that is vertically adjacent to the second induction section of the second power segment 608 and overlaps the second power segment 608 by a threshold amount to dampen resonance of the second resonant current loop 615. The ground-routing 134 (e.g., the first ground segment 402) includes a first induction section and the first pickup loop 616 includes a third induction section that is vertically adjacent to the first induction section of the ground-routing 134 and overlaps the ground-routing 134 by a threshold amount to dampen resonance of the first resonant current loop 614. The ground-routing 134 includes a second induction section and the second pickup loop 618 includes a fourth induction section that is vertically adjacent to the second induction section of the ground-routing 134 and overlaps the ground-routing 134 by a threshold amount to dampen resonance of the second resonant current loop 615. According to an example, the first induction section of the ground-routing 134 is the same as the second induction section of the ground-routing 134. Other arrangements and/or configurations of the first power segment 602, the second power segment 608, the first ground segment 402, the first pickup loop 616, and the second pickup loop 618 are within the scope of the present disclosure.

FIG. 14B illustrates a first area 1420 spanned by the first resonant current loop 614 and a second area 1422 spanned by the first pickup loop 616. According to an example, the first pickup loop 616 is provided with dimensions to (1) maximize the inductive coupling coefficient K between the first resonant current loop 614 and the first pickup loop 616, and (2) to tune the series resistance value Rm4,loop1 of the first pickup loop resistor 662, as described above with reference to FIG. 6E, through flexible routing and layout. For example, the intersection between the first area 1420 and the second area 1422 is greater than 25% of the first area 1420. According to equation 13, when the first area 1420 is the first area $A_{LOOP1}$ and the second area 1422 is the second area $A_{LOOP2}$, the area overlap quotient $A_{QUOTIENT}$ is greater than 0.25 between the first resonant current loop 614 and the first pickup loop 616. In view of the above example, the first pickup current loop 1410 of the first pickup loop 616 is significantly inductively coupled to the first resonant current loop 614.

FIG. 14C illustrates a third area 1424 spanned by the second resonant current loop 615 and a fourth area 1426 spanned by the second pickup loop 618. According to an example, the second pickup loop 618 is provided with dimensions to (1) maximize the inductive coupling coefficient K between the second resonant current loop 615 and the second pickup loop 618, and (2) to tune the series resistance value Rm4,loop2 of the second pickup loop resistor 666, as described above with reference to FIG. 6E, through flexible routing and layout. For example, the intersection between the third area 1424 and the fourth area 1426 is greater than 25% of the third area 1424. According to equation 13, when the third area 1424 is the first area $A_{LOOP1}$ and the fourth area 1426 is the second area $A_{LOOP2}$, the area overlap quotient $A_{QUOTIENT}$ is greater than 0.25 between the second resonant current loop 615 and the second pickup loop 618. In view of the above example, the second pickup current loop 1412 of the second pickup loop 618 is significantly inductively coupled to the second resonant current loop 615.

Figure 15A:
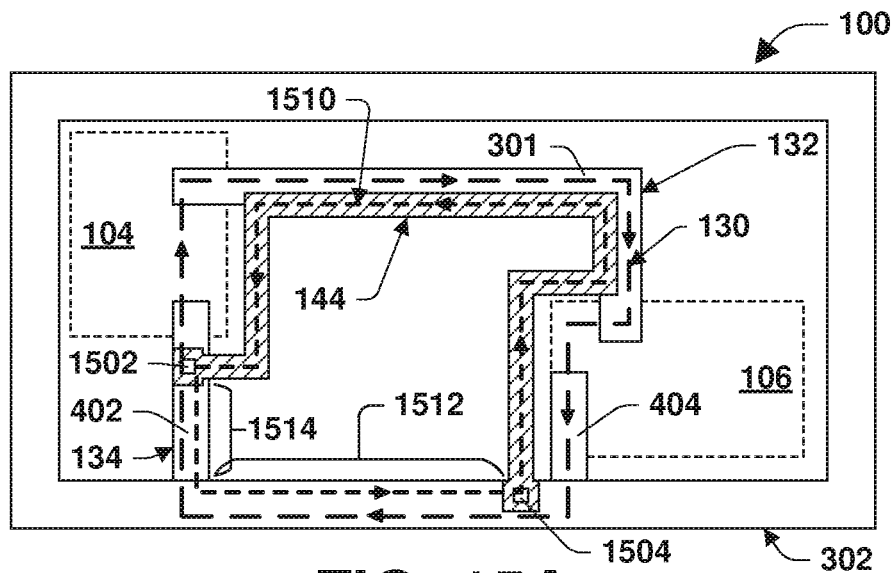
FIGS. 15A and 15B are bottom-up views of an integrated circuit, according to some embodiments.
Figure 15B:
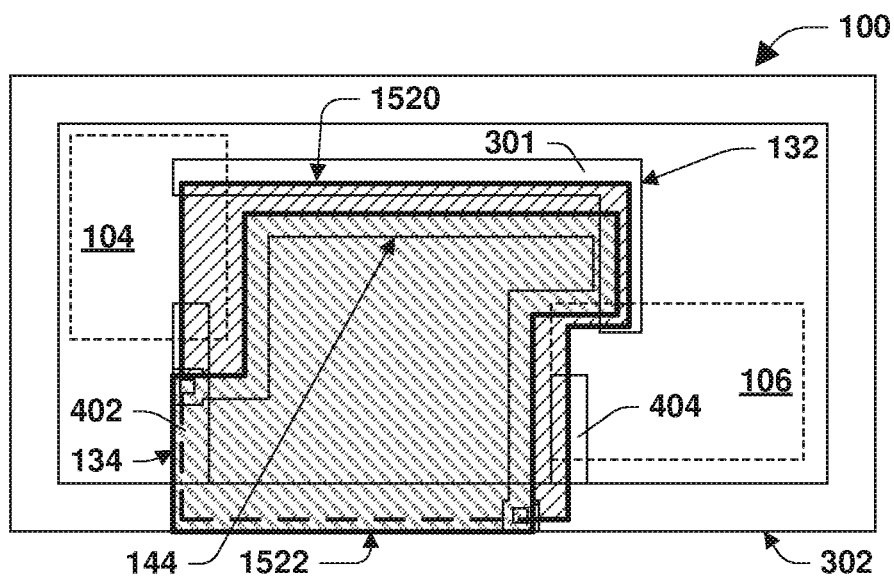

FIGS. 15A and 15B are bottom-up views of the IC 100, according to some examples. FIG. 15A is similar to FIG. 12A and illustrates an example in which the resonant current loop 130 is formed between the first circuit module 104 and the second circuit module 106 along the power segment 301, the second ground segment 404, the seal ring 302, and the first ground segment 402. The power segment 301, the first ground segment 402, and/or the second ground segment 404 are formed in a metal interconnect layer (e.g., the fifth metal layer 240 of FIG. 2B). The first ground segment 402 and the second ground segment 404 are electrically coupled to the seal ring 302.

In the example illustrated in FIG. 15A, the pickup loop 144 is formed as a segment that is connected to ground and shares a section with the seal ring 302, in which also a part of the resonant current loop 130 is formed. According to an example, having a section that is common between the resonant current loop 130 and a pickup current loop 1510, as depicted in FIG. 15A, may provide a beneficial increase in the inductive coupling coefficient K. This is especially true if, as illustrated, the resonant current loop 130 is flowing over the seal ring 302, because it may not be possible to place the pickup loop 144 vertically below or vertically above the seal ring 302. The pickup loop 144 is electrically connected to the first ground segment 402 at a first via 1502 and is electrically connected to the seal ring 302 at a second via 1504. The first ground segment 402 is also electrically connected to the seal ring 302. The pickup loop 144 closely follows the power segment 301 and the second ground segment 404. In the example illustrated in FIG. 15A, a portion of the pickup loop 144 vertically overlaps a portion of the power segment 301. In another example, a portion of the pickup loop 144 completely overlaps a portion of the power segment 301. The pickup current loop 1510 is induced in the pickup loop 144 in response to the resonant current loop 130. In the illustrated example, the resonant current loop 130 has a non-rectangular shape and the pickup loop 144 has a different shape, such as the illustrated non-rectangular shape.

In the example illustrated in FIGS. 15A and 15B, the pickup loop 144 is formed in an interconnect layer of the interconnect layer stack 210 different from the power segment 301 and the first ground segment 402. In an example, the power segment 301, the first ground segment 402, and the second ground segment 404 are formed in the fifth metal layer 240 of the interconnect layer stack 210 and the pickup loop 144 is formed in the fourth metal layer 238 of the interconnect layer stack 210. According to an example, the pickup loop 144 may be configured to follow the resonant current loop 130 as illustrated in FIG. 15A. The power-routing 132 includes an induction section and the pickup loop 144 includes an induction section that is vertically adjacent to the induction section of the power-routing 132 and overlaps the power-routing 132 by a threshold amount to dampen resonance of the resonant current loop 130.

In the example of FIG. 15A, the ground-routing 134 includes a first portion 1512 of the seal ring 302 and a second portion 1514 of the first ground segment 402. Together, the first portion 1512 and the second portion 1514 form a shared conductive segment that is in common with the resonant current loop 130 and the pickup current loop 1510. In this example, the resonant current loop 130 and the pickup current loop 1510 travel in the shared conductive segment. Other arrangements and/or configurations of the power segment 301, the first ground segment 402, the second ground segment 404, and the pickup loop 144 are within the scope of the present disclosure.

FIG. 15B illustrates a first area 1520 spanned by the resonant current loop 130 and a second area 1522 spanned by the pickup loop 144. According to an example, the pickup loop 144 is provided with dimensions to (1) maximize the inductive coupling coefficient K, and (2) to tune the series resistance value Rm4,loop of the pickup loop resistor 148, as described above, through flexible routing and layout. For example, the intersection between the first area 1520 and the second area 1522 is greater than 25% of the first area 1520. According to equation 13, when the first area 1520 is the first area $A_{LOOP1}$ and the second area 1522 is the second area $A_{LOOP2}$, the area overlap quotient $A_{QUOTIENT}$ is greater than 0.25 between the resonant current loop 130 and the pickup loop 144. In view of the above example, the pickup current loop 1510 of the pickup loop 144 is significantly inductively coupled to the resonant current loop 130.

Figure 16A:
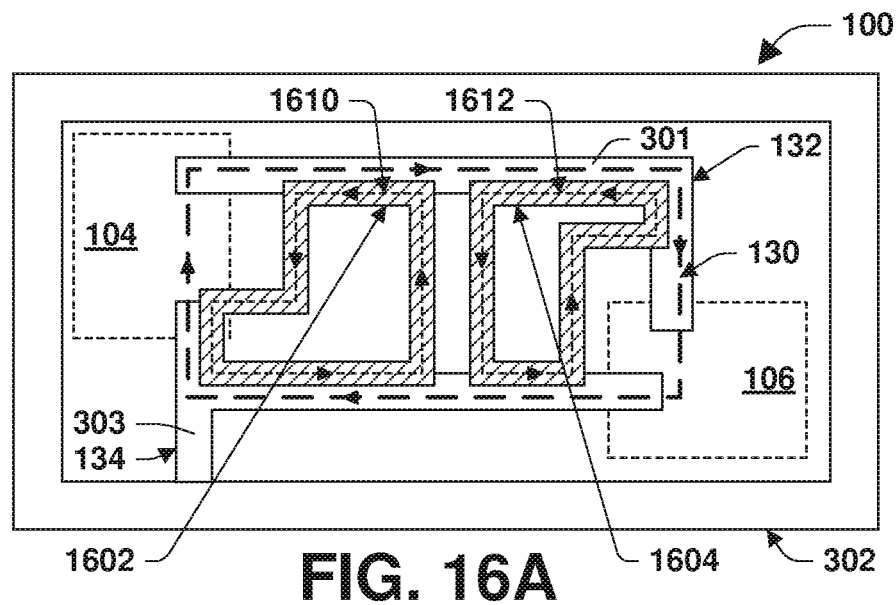
FIGS. 16A and 16B are bottom-up views of an integrated circuit, according to some embodiments.
Figure 16B:
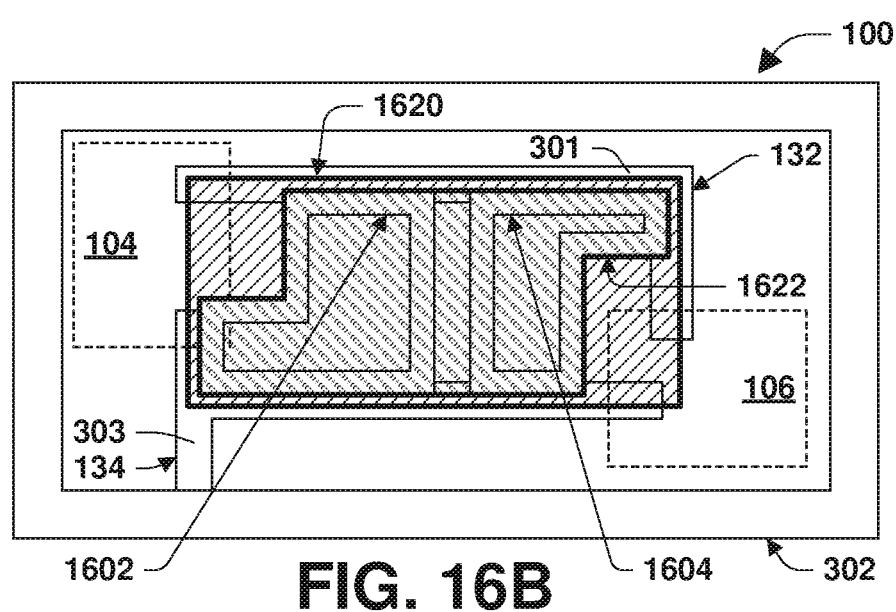

FIGS. 16A and 16B are bottom-up views of the IC 100, according to some examples. FIG. 16A is similar to FIG. 3A and illustrates an example in which the resonant current loop 130 is formed between the first circuit module 104 and the second circuit module 106 along the power segment 301 and the ground segment 303. The power segment 301 and/or the ground segment 303 are formed in a metal interconnect layer (e.g., the fifth metal layer 240 of FIG. 2B).

In the example illustrated in FIG. 16A, the first pickup loop 1602 and a second pickup loop 1604 are formed as non-connected loops that are not coupled to ground. In another example, one or both of the first pickup loop 1602 and the second pickup loop 1604 are coupled to ground, to an internally generated power supply, and/or to each other. The first pickup loop 1602 and the second pickup loop 1604 closely follow the power segment 301 and the ground segment 303. In the example illustrated in FIG. 16A, a portion of the first pickup loop 1602 and a portion of the second pickup loop 1604 vertically overlap a portion of the power segment 301 and a portion of the ground segment 303. In another example, one or both of the first pickup loop 1602 and the second pickup loop 1604 include a portion that completely overlaps a portion of the power segment 301 or a portion of the ground segment 303. A first pickup current loop 1610 is induced in the first pickup loop 1602 in response to the resonant current loop 130. A second pickup current loop 1612 is induced in the second pickup loop 1604 in response to the resonant current loop 130. In the illustrated example, the resonant current loop 130 has a rectangular shape and the first pickup loop 1602 and the second pickup loop 1604 have a different shape, such as the illustrated non-rectangular shape. In another example, the resonant current loop 130 has a non-rectangular shape and the first pickup loop 1602 and the second pickup loop 1604 have a different shape such that a portion of the first pickup loop 1602 and/or a portion of the second pickup loop 1604 closely follow the non-rectangular shape of the resonant current loop 130.

In the example illustrated in FIGS. 16A and 16B, the first pickup loop 1602 and the second pickup loop 1604 are formed in an interconnect layer of the interconnect layer stack 210 different from the power segment 301 and the first ground segment 402. In various examples, the first pickup loop 1602 and the second pickup loop 1604 are formed in the same interconnect layer or different interconnect layers. In an example, the power segment 301 and the ground segment 303 are formed in the fifth metal layer 240 of the interconnect layer stack 210 and the first pickup loop 1602 and the second pickup loop 1604 are formed in the fourth metal layer 238 of the interconnect layer stack 210. According to an example, the first pickup loop 1602 and the second pickup loop 1604 may be configured to follow portions of the resonant current loop 130 as illustrated in FIG. 16A. The power-routing 132 includes a first induction section and the first pickup loop 1602 includes a first induction section that is vertically adjacent to the first induction section of the power-routing 132 and overlaps the power-routing 132 by a threshold amount to dampen resonance of the resonant current loop 130. The ground-routing 134 includes a first induction section and the first pickup loop 1602 includes a second induction section that is vertically adjacent to the first induction section of the ground-routing 134 and overlaps the ground-routing 134 by a threshold amount to dampen resonance of the resonant current loop 130. The power-routing 132 includes a second induction section and the second pickup loop 1604 includes a first induction section that is vertically adjacent to the second induction section of the power-routing 132 and overlaps the power-routing 132 by a threshold amount to dampen resonance of the resonant current loop 130. The ground-routing 134 includes a second induction section and the second pickup loop 1604 includes a second induction section that is vertically adjacent to the second induction section of the ground-routing 134 and overlaps the ground-routing 134 by a threshold amount to dampen resonance of the resonant current loop 130. Other arrangements and/or configurations of the power segment 301, the ground segment 303, the first pickup loop 1602, and the second pickup loop 1604 are within the scope of the present disclosure.

FIG. 16B illustrates a first area 1620 spanned by the resonant current loop 130 and a second area 1622 spanned by the first pickup loop 1602 and the second pickup loop 1604. According to an example, the first pickup loop 1602 and the second pickup loop 1604 are provided with dimensions to (1) maximize the inductive coupling coefficient K between the resonant current loop 130 and both of the first pickup loop 1602 and the second pickup loop 1604, and (2) to tune the series resistance value of both of the first pickup loop 1602 and the second pickup loop 1604, as described above, through flexible routing and layout. For example, the intersection between the first area 1620 and the second area 1622 is greater than 25% of the first area 1620. According to equation 13, when the first area 1620 is the first area $A_{LOOP1}$ and the second area 1622 is the second area $A_{LOOP2}$, the area overlap quotient $A_{QUOTIENT}$ is greater than 0.25 between the resonant current loop 130 and the first pickup loop 1602 and the second pickup loop 1604. In view of the above example, the first pickup current loop 1610 and the second pickup current loop 1612 are significantly inductively coupled to the resonant current loop 130.

Figure 17A:
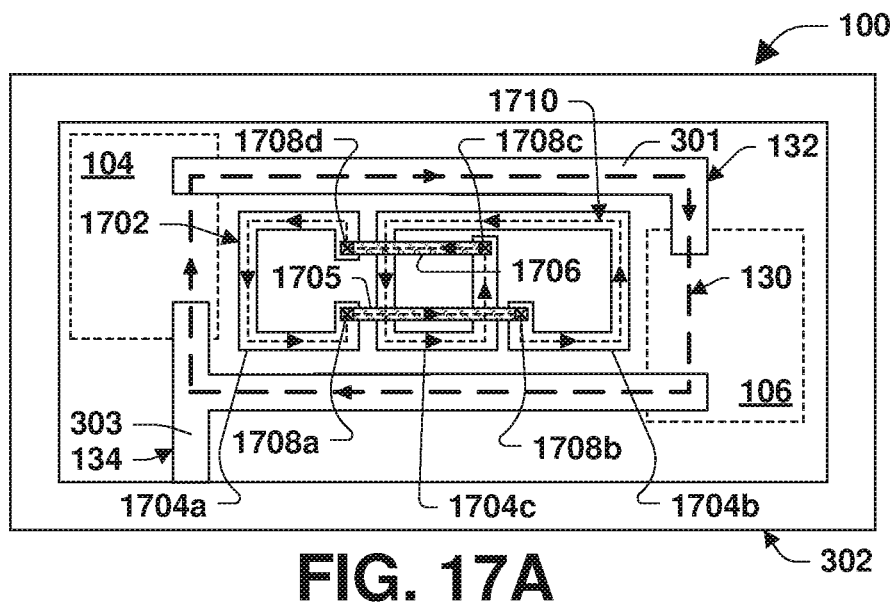
FIGS. 17A and 17B are bottom-up views of an integrated circuit, according to some embodiments.
Figure 17B:
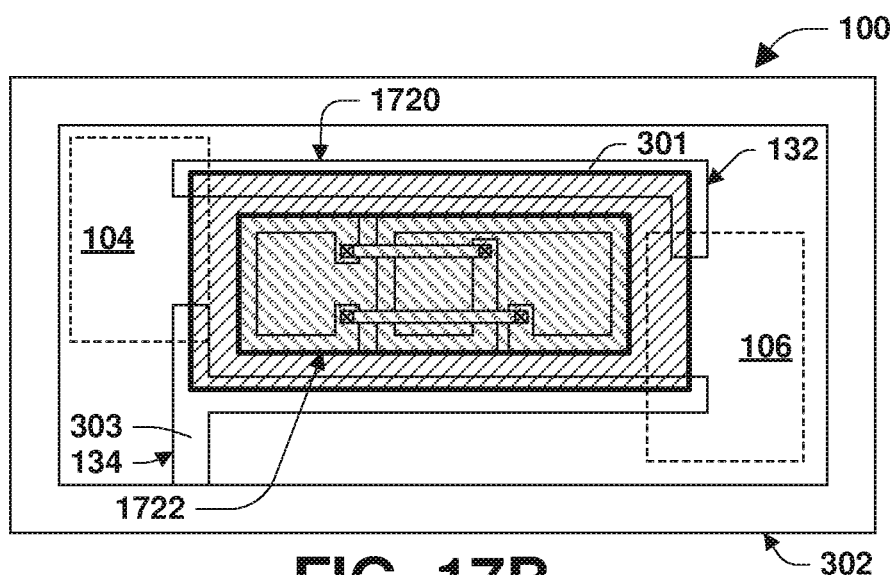

FIGS. 17A and 17B are bottom-up views of the IC 100, according to some examples. FIG. 17A is similar to FIG. 3A and illustrates an example in which the resonant current loop 130 is formed between the first circuit module 104 and the second circuit module 106 along the power segment 301 and the ground segment 303. The power segment 301 and/or the ground segment 303 are formed in a metal interconnect layer (e.g., the fifth metal layer 240 of FIG. 2B).

According to an example, a pickup loop 1702 is formed as a plurality of connected winding sections (e.g., winding sections 1704a-1704c) that are floating and not coupled to power or ground. In the illustrated example, a first winding section 1704a is electrically connected to a first connecting section 1705 by way of first via 1708a. The first connecting section 1705 is electrically connected to a second winding section 1704b by way of a second via 1708b. The second winding section is electrical connected to and flows into a third winding section 1704c. The third winding section 1704c is electrically connected to a second connecting section 1706 by way of a third via 1708c. The second connecting section 1706 is electrically connected to the first winding section 1704*a* by way of a fourth via 1708*d*. In another example, one or more winding sections of the pickup loop 1702 are coupled to ground. The pickup loop 1702 closely follows the power segment 301 and the ground segment 303. In the illustrated example, the pickup loop 1702 does not vertically overlap the power segment 301 or the ground segment 303. In another example, one or more winding sections of the pickup loop 1702 include portions that overlap a portion of the power segment 301 or a portion of the ground segment 303. In yet another example, one or more winding sections of the pickup loop 1702 include portions that partially overlap a portion of the power segment 301 or partially overlap a portion of the ground segment 303. A pickup current loop 1710 is induced in the pickup loop 1702 in response to the resonant current loop 130. In the illustrated example, the resonant current loop 130 has a rectangular shape and the pickup loop 1702 has a different shape, such as the illustrated non-rectangular shape. In another example, the resonant current loop 130 may have a non-rectangular shape and the pickup loop 1702 may have a same or different shape.

In the example illustrated in FIGS. 17A and 17B, the pickup loop 1702 is formed in at least two interconnect layers of the interconnect layer stack 210, with at least one interconnect layer being different from the power segment 301 and/or the ground segment 303. In an example, the power segment 301 and the ground segment 303 are formed in the fifth metal layer 240 of the interconnect layer stack 210 and the pickup loop 1702 is formed in the fourth metal layer 238 and the third metal layer 230 of the interconnect layer stack 210. Other arrangements and/or configurations of the power segment 301, the ground segment 303, and the pickup loop 1702 are within the scope of the present disclosure.

FIG. 17B illustrates a first area 1720 spanned by the resonant current loop 130 and a second area 1722 spanned by the pickup loop 1702. According to an example, the pickup loop 1702 is provided with dimensions to (1) maximize the inductive coupling coefficient K, and (2) to tune the series resistance value Rm4,loop of the pickup loop resistor 148, as described above, through flexible routing and layout. For example, the intersection between the first area 1720 and the second area 1722 is greater than 25% of the first area 1720. According to equation 13, when the first area 1720 is the first area $A_{LOOP1}$ and the second area 1722 is the second area $A_{LOOP2}$, the area overlap quotient $A_{QUOTIENT}$ is greater than 0.25 between the resonant current loop 130 and the pickup loop 1702. In view of the above example, the pickup current loop 1710 is significantly inductively coupled to the resonant current loop 130.

It may be appreciated that by applying one or more of the techniques described herein, such as by implementing one or more pickup loops, the IC may have improved protection against resonant current loops, thereby unfavorable/detrimental resonances in the IC may be dampened/reduced/avoided. Implementing one or more pickup loops may allow the IC 100 to meet an EMC specification or satisfy EMC requirements (e.g., proper function under external RF-disturbance, low emitted level of disturbance, etc.). Further, by implementing one or more pickup loops in the IC, which may result in reduction of on-chip resonances, the integrity of the internal power supply may be improved during normal operation. This technique is particularly applicable to mixed-signal ICs, PICs, Smart Power ICs, complex SoCs, Automotive System ICs, and/or PMIC. For example, on-chip resonances may be dampened (from a Q-factor of 3 reduced down to a Q-factor<1) by implementing an on-die pickup loop. A reduction in system costs and/or development costs may be provided by addressing EMC issues on a chip level (e.g., not at the PCB level). Implementing one or more pickup loops on-die in an IC may reduce on-chip-resonances with no introduction of a DC voltage drop and without degrading the effectiveness of on-chip blocking capacitors. Implementing one or more pickup loops may provide a safe upper bound on the Q-factor for internal resonant current loops, regardless of a Q-factor value without introduction of a pickup loop. This shows that aspects of the present disclosure are very useful as a (conservative) safety measure against potentially/suspectedly resonant current loops. In an example, if an EMC requirements violation is found after the production of sample ICs, then one can update the reticles (e.g., in a metal-fix by replacing only 3 reticles instead of 50). In this case, new improved samples may be quickly produced (e.g., using wafers that were put on-hold after FEOL-processing). One or more pickup loops may be provided in unused parts of metal layers, and hence constitutes a cost effective counter-measure.

According to some embodiments, an integrated circuit including a first circuit module, a second circuit module, and a layer stack is provided. The layer stack comprises a metal layer comprising a power segment connected to the first circuit module and the second circuit module, and a ground segment connected to the first circuit module and the second circuit module. The first circuit module, the second circuit module, the power segment, and the ground segment form a resonant current loop. A pickup loop is inductively coupled to the resonant current loop to reduce a Q-factor of the resonant current loop.

According to some embodiments, the Q-factor is reduced to less than 4.

According to some embodiments, the Q-factor is reduced by more than a factor of 1.5.

According to some embodiments, the pickup loop is in at least one of the metal layer or a metal layer below the metal layer.

According to some embodiments, the pickup loop is floating such that the pickup loop is not connected to ground.

According to some embodiments, the pickup loop is a continuous metal sheet and the pickup loop inductance is formed by eddy currents in the continuous metal sheet.

According to some embodiments, a seal ring frames an outer periphery of the layer stack and is electrically connected to the ground segment. The seal ring is electrically connected to the first circuit module.

According to some embodiments, a width of the pickup loop is tuned to vary a resistance of the pickup loop to approximate an impedance of an inductance of the pickup loop at a resonance frequency of the resonant current loop.

According to some embodiments, the metal layer comprises a second power segment connected to the first circuit module, the second circuit module, and the seal ring. The first circuit module, the second circuit module, the second power segment, and the seal ring form a second resonant current loop. The layer stack comprises a second pickup loop inductively coupled to the second resonant current loop.

According to some embodiments, the pickup loop is electrically connected to the second pickup loop.

According to some embodiments, an integrated circuit including a first circuit module and a second circuit module is provided. A layer stack comprises a metal layer. The metal layer comprises a power segment connected to the first circuit module and the second circuit module. A ground segment is connected to the first circuit module and the second circuit module. The first circuit module, the second circuit module, the power segment, and the ground segment form a resonant current loop having a resonance frequency. A structure is inductively coupled to the resonant current loop having a resistance tuned to generate losses at the resonance frequency.

According to some embodiments, the structure comprises a first pickup loop inductively coupled to the resonant current loop.

According to some embodiments, the structure comprises a second pickup loop inductively coupled to the resonant current loop.

According to some embodiments, the first pickup loop includes an induction section and the second pickup loop includes the induction section of the first pickup loop.

According to some embodiments, the resonant current loop has a complex series impedance including an inductance, and a resistance of the structure is tuned to match a reactance of the structure to the inductance.

According to some embodiments, the resonant current loop has a series loss tangent equal to a quotient of a real part and an imaginary part of a complex series impedance, and the structure is tuned to increase the series loss tangent.

According to some embodiments, the structure is inductively coupled to the resonant current loop with an inductive coupling coefficient greater than 25%.

According to some embodiments, an integrated circuit including a first circuit module and a second circuit module is provided. A layer stack comprises a metal layer. The metal layer comprises a power segment connected to the first circuit module and the second circuit module. A ground segment is connected to the first circuit module and the second circuit module. The first circuit module, the second circuit module, the power segment, and the ground segment form a resonant current loop. A pickup loop is inductively coupled to the resonant current loop. The pickup loop comprises a section vertically adjacent to a section of the power segment and overlapping the section of the power segment by a threshold amount to dampen a resonance of the resonant current loop.

According to some embodiments, the resonant current loop has a series loss tangent equal to a quotient of a real part and an imaginary part of a complex series impedance. The pickup loop is tuned to increase the series loss tangent.

According to some embodiments, the pickup loop has a series resistance tuned to increase the series loss tangent.

It may be appreciated that combinations of one or more embodiments described herein, including combinations of embodiments described with respect to different figures, are contemplated herein.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

Any aspect or design described herein as an "example" is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

While the subject matter has been described with reference to illustrative embodiments, this description is not intended to be construed in a limiting sense. Various modifications and combinations of the illustrative embodiments, as well as other embodiments of the present disclosure, will be apparent to persons skilled in the art upon reference to the description. It is therefore intended that the appended claims encompass any such modifications or embodiments.

What is claimed is:
1. An integrated circuit, comprising:
a first circuit module and a second circuit module; and
a layer stack comprising:
    a metal layer, comprising:
        a power segment connecting the first circuit module to the second circuit module; and
        a ground segment connected to the first circuit module and the second circuit module, wherein the first circuit module, the second circuit module, the power segment, and the ground segment form a resonant current loop; and a pickup loop inductively coupled to the resonant current loop to reduce a Q-factor of the resonant current loop.

2. The integrated circuit according to claim 1, wherein the Q-factor is reduced to less than 4.

3. The integrated circuit according to claim 1, wherein the Q-factor is reduced by more than a factor of 1.5.

4. The integrated circuit according to claim 1, wherein the pickup loop is in at least one of the metal layer or a metal layer below the metal layer.

5. The integrated circuit according to claim 1, wherein the pickup loop is floating such that the pickup loop is not connected to ground.

6. The integrated circuit according to claim 1, wherein the pickup loop is a continuous metal sheet and pickup loop inductance is formed by eddy currents in the continuous metal sheet.

7. The integrated circuit according to claim 1, comprising:
a seal ring framing an outer periphery of the layer stack and electrically connected to the ground segment, wherein the seal ring is electrically connected to the first circuit module.

8. The integrated circuit according to claim 1, wherein a width of the pickup loop is tuned to vary a resistance of the pickup loop to approximate an impedance of an inductance of the pickup loop at a resonance frequency of the resonant current loop.

9. The integrated circuit according to claim 1, comprising:
a seal ring framing an outer periphery of the layer stack and connected to the ground segment,
wherein the metal layer comprises
a second power segment connected to the first circuit module, the second circuit module, and the seal ring, wherein the first circuit module, the second circuit module, the second power segment, and the seal ring form a second resonant current loop, and
wherein the layer stack comprises
a second pickup loop inductively coupled to the second resonant current loop.

10. The integrated circuit according to claim 9, wherein the pickup loop is electrically connected to the second pickup loop.

11. An integrated circuit, comprising:
a first circuit module and a second circuit module; and
a layer stack comprising:
a metal layer, comprising:
a power segment connecting the first circuit module to the second circuit module; and
a ground segment connected to the first circuit module and the second circuit module, wherein the first circuit module, the second circuit module, the power segment, and the ground segment form a resonant current loop 130 having a resonance frequency; and
a structure inductively coupled to the resonant current loop having a resistance tuned to generate losses at the resonance frequency.

12. The integrated circuit according to claim 11, wherein the structure comprises:
a first pickup loop inductively coupled to the resonant current loop.

13. The integrated circuit according to claim 12, wherein the structure comprises:
a second pickup loop inductively coupled to the resonant current loop.

14. The integrated circuit according to claim 13, wherein the first pickup loop includes an induction section and the second pickup loop includes the induction section of the first pickup loop.

15. The integrated circuit according to claim 11, wherein the resonant current loop has a complex series impedance including an inductance, and wherein a resistance of the structure is tuned to match a reactance of the structure to the inductance.

16. The integrated circuit according to claim 11, wherein the resonant current loop has a series loss tangent equal to a quotient of a real part and an imaginary part of a complex series impedance, and the structure is tuned to increase the series loss tangent.

17. The integrated circuit according to claim 11, wherein the structure is inductively coupled to the resonant current loop with an inductive coupling coefficient greater than 25%.

18. An integrated circuit, comprising:
a first circuit module and a second circuit module; and
a layer stack comprising:
a metal layer, comprising:
a power segment connecting the first circuit module to the second circuit module; and
a ground segment connected to the first circuit module and the second circuit module, wherein the first circuit module, the second circuit module, the power segment, and the ground segment form a resonant current loop; and
a pickup loop, inductively coupled to the resonant current loop, comprising:
a section vertically adjacent to a section of the power segment and overlapping the section of the power segment by a threshold amount to dampen a resonance of the resonant current loop.

19. The integrated circuit according to claim 18, wherein the resonant current loop has a series loss tangent equal to a quotient of a real part and an imaginary part of a complex series impedance, and
the pickup loop is tuned to increase the series loss tangent.

20. The integrated circuit according to claim 19, wherein the pickup loop has a series resistance tuned to increase the series loss tangent.

* * * * *